US012690355B2

(12) United States Patent
Han et al.

(10) Patent No.: US 12,690,355 B2
(45) Date of Patent: Jul. 21, 2026

(54) DISPLAY APPARATUS

(71) Applicant: Samsung Display Co., Ltd., Yongin-si (KR)

(72) Inventors: Jeongwon Han, Yongin-si (KR); Donghyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 550 days.

(21) Appl. No.: 18/135,042

(22) Filed: Apr. 14, 2023

(65) Prior Publication Data

US 2023/0403905 A1 Dec. 14, 2023

(30) Foreign Application Priority Data

Jun. 9, 2022 (KR) ........................ 10-2022-0070296

(51) Int. Cl.
H10K 59/38 (2023.01)
H10K 59/122 (2023.01)

(52) U.S. Cl.
CPC ........... H10K 59/38 (2023.02); H10K 59/122 (2023.02)

(58) Field of Classification Search
None
See application file for complete search history.

(56) References Cited

U.S. PATENT DOCUMENTS

| | | | |
|---|---|---|---|
| 6,660,332 B2 | 12/2003 | Kawase et al. | |
| 10,079,272 B2 | 9/2018 | Song et al. | |
| 11,061,268 B2 | 7/2021 | Park et al. | |
| 11,571,706 B2 | 2/2023 | Miyazaki et al. | |
| 2007/0188537 A1 | 8/2007 | Kim et al. | |
| 2019/0355577 A1 | 11/2019 | Kim | |
| 2022/0003909 A1* | 1/2022 | Song | G02B 5/201 |
| 2022/0052296 A1 | 2/2022 | Noh et al. | |
| 2022/0115612 A1 | 4/2022 | Ahn et al. | |
| 2022/0208859 A1* | 6/2022 | Hong | H10K 59/38 |

(Continued)

FOREIGN PATENT DOCUMENTS

| | | |
|---|---|---|
| CN | 105140236 B | 8/2019 |
| CN | 113540188 A | 10/2021 |
| KR | 10-2002-0039614 A | 5/2002 |

(Continued)

OTHER PUBLICATIONS

OLEDNet, "Samsung Display decided to invest 13 Trillion won in QD-OLED by 2025," Nov. 1, 2019 / in Display, Equipment, Focus on / by olednet, www.olednet.com with English Translation, 2 pages.

*Primary Examiner* — Michelle Mandala
(74) *Attorney, Agent, or Firm* — Womble Bond Dickinson (US) LLP

(57) ABSTRACT

A display apparatus includes: a first substrate; a bank on the first substrate and including partition walls defining a first well, a second well, a third well, and auxiliary wells, a first quantum dot layer in the first well; and a second quantum dot layer in the second well. The partition walls have a second width that is less than a first width. The first width is an average width of the partition walls farther away from a cross point at where three or more partition walls extending in different directions meet one another, and the second width is an average width of the partition walls at the cross point; a first quantum dot layer in the first well; and a second quantum dot layer in the second well.

5 Claims, 16 Drawing Sheets

(56)     References Cited

U.S. PATENT DOCUMENTS

| 2022/0231087 A1 * | 7/2022 | Jeon | ....................... H10K 59/38 |
| 2022/0359798 A1 * | 11/2022 | Kim | ....................... H10K 59/38 |

FOREIGN PATENT DOCUMENTS

| KR | 10-2007-0082386 A | 8/2007 |
| KR | 10-2011-0083902 A | 7/2011 |
| KR | 10-2018-0102489 A | 9/2018 |
| KR | 10-2019-0010821 A | 1/2019 |
| KR | 10-2019-0131189 A | 11/2019 |
| KR | 10-2022-0022015 A | 2/2022 |
| KR | 10-2022-0048506 A | 4/2022 |
| KR | 10-2022-0105253 A | 7/2022 |

* cited by examiner

DISPLAY APPARATUS

CROSS-REFERENCE TO RELATED APPLICATION

This application claims priority to and the benefit of Korean Patent Application No. 10-2022-0070296, filed on Jun. 9, 2022, in the Korean Intellectual Property Office, the disclosure of which is incorporated by reference herein in its entirety.

BACKGROUND

1. Field

Aspects of embodiments of the present disclosure relate to a display apparatus.

2. Description of the Related Art

Generally, a display apparatus includes a plurality of pixels. The pixel may emit different color light to provide a full-color display apparatus. To this end, at least some pixels of the display apparatus may have a color conversion portion. Accordingly, light having a wavelength in a first wavelength band, generated in an emission portion of some of the pixels, is converted into light having a wavelength in a second wavelength band while passing through a corresponding color conversion portion and is then emitted to the outside.

SUMMARY

Such a display apparatus according to the related art has a relatively high possibility of defects occurring during a manufacturing process.

Accordingly, one or more embodiments of the present disclosure include a display apparatus which reduce the possibility of defects occurring during a manufacturing process. However, this is merely an example, and the present disclosure is not limited thereto.

Additional aspects and features will be set forth, in part, in the description which follows and, in part, will be apparent from the description or may be learned by practice of the embodiments described in the disclosure.

According to an embodiment of the present disclosure, a display apparatus includes: a first substrate; a bank on the first substrate; a first quantum dot layer in the first well; and a second quantum dot layer in the second well. The bank includes partition walls defining a first well, a second well, a third well, and auxiliary wells. The partition walls have a second width that is less than a first width. The first width is an average width of the partition walls farther away from a cross point at where three or more partition walls extending in different directions meet one another, and the second width is an average width of the partition walls at the cross point.

The first quantum dot layer may be configured to convert light having a wavelength in a first wavelength band into light having a wavelength in a second wavelength band as it passes therethrough, and the second quantum dot layer may be configured to convert light having a wavelength in the first wavelength band into light having a wavelength in a third wavelength band as it passes therethrough.

The display apparatus may further include a transmissive layer in the third well through which light is transmitted without change to its wavelength.

The display apparatus may further include: a second substrate under the first substrate with the bank therebetween; a first pixel electrode corresponding to the first well, a second pixel electrode corresponding to the second well, and a third pixel electrode corresponding to the third well, the first to third pixel electrodes being apart from one another on the second substrate; a pixel-defining layer covering edges of each of the first pixel electrode, the second pixel electrode, and the third pixel electrode and having an opening exposing a central portion of the first pixel electrode, an opening exposing a central portion of the second pixel electrode, and an opening exposing a central portion of the third pixel electrode; an emission layer on the first to third pixel electrodes and configured to emit light having a wavelength in a first wavelength band; and an opposite electrode on the emission layer.

The partition walls of the bank may define a fourth well that, in a plan view, is apart from the first pixel electrode, the second pixel electrode, and the third pixel electrode, and each of the first to fourth wells may be surrounded, in the plan view, by the auxiliary wells.

According to another embodiment of the present disclosure, a display apparatus includes: a bank on a first substrate; a first quantum dot layer in the first well; and a second quantum dot layer in the second well. The bank includes partition walls defining a first well, a second well, a third well, and auxiliary wells, and the partition walls have at least one groove therein between neighboring partition walls at a cross point at where three or more partition walls extending in different directions meet one another.

The first quantum dot layer may be configured to convert light having a wavelength in a first wavelength band into light having a wavelength in a second wavelength band as it passes therethrough, and the second quantum dot layer may be configured to convert light having a wavelength in the first wavelength band into light having a wavelength in a third wavelength band as it passes therethrough.

The display apparatus may further include a transmissive layer in the third well through which light is transmitted without change to its wavelength.

In a plan view, the at least one groove may have a wedge shape widening in a direction from the cross point toward side surfaces of the neighboring partition walls.

In a plan view, the at least one groove may have a straight shape passing through the cross point, and upper surfaces of the neighboring partition walls may be separated by the at least one groove at the cross point.

A height of the at least one groove may be the same as that of the bank.

Upper and side surfaces of the bank may be hydrophobic.

A height of the at least one groove may be less than a height of the bank, and a height of each of the first quantum dot layer and the second quantum dot layer may be the same as or less than the height of the bank minus the height of the at least one groove.

A width of the at least one groove may be 1 μm or less.

The display apparatus may further include: a second substrate under the first substrate with the bank therebetween; a first pixel electrode corresponding to the first well, a second pixel electrode corresponding to the second well, and a third pixel electrode corresponding to the third well, the first to third pixel electrodes being apart from one another on the second substrate; a pixel-defining layer covering edges of each of the first pixel electrode, the second pixel electrode, and the third pixel electrode and having an opening exposing a central portion of the first pixel electrode, an opening exposing a central portion of the second pixel electrode, and an opening exposing a central portion of the third pixel electrode; an emission layer on the first to third pixel electrodes and configured to emit light having a wavelength in a first wavelength band; and an opposite electrode on the emission layer.

The partition walls of the bank may define a fourth well that, in a plan view, is apart from the first pixel electrode, the second pixel electrode, and the third pixel electrode, and each of the first to fourth wells may be surrounded, in the plan view, by the auxiliary wells.

According to another embodiment of the present disclosure, a display apparatus includes: a first substrate; a bank over the first substrate and including partition walls defining a first well, a second well, a third well, and auxiliary wells; a first quantum dot layer in the first well; a second quantum dot layer in the second well; and a transmissive layer in the third well through which light is transmitted without change to its wavelength. At a cross point at where partition walls extending in different directions from among the partition walls meet one another, three or less partition walls meet one another.

The display apparatus may further include: a second substrate under the first substrate with the bank therebetween; a first pixel electrode corresponding to the first well, a second pixel electrode corresponding to the second well, and a third pixel electrode corresponding to the third well, the first to third pixel electrodes being apart from one another on the second substrate; a pixel-defining layer covering edges of each of the first pixel electrode, the second pixel electrode, and the third pixel electrode and having an opening exposing a central portion of the first pixel electrode, an opening exposing a central portion of the second pixel electrode, and an opening exposing a central portion of the third pixel electrode; an emission layer on the first to third pixel electrodes and configured to emit light having a wavelength in a first wavelength band; and an opposite electrode on the emission layer. The partition walls of the bank may define a fourth well that, in a plan view, is apart from the first pixel electrode, the second pixel electrode, and the third pixel electrode, and each of the first to fourth wells may be surrounded, in the plan view, by the auxiliary wells.

The partition walls may have a second width that is less than a first width. The first width may be an average width of the partition walls at an area farther from the cross point, the second width may be an average width of the partition walls at the cross point.

The partition walls may have at least one groove between neighboring partition walls at the cross point.

BRIEF DESCRIPTION OF THE DRAWINGS

The above and other aspects and features of embodiments of the present disclosure will be more apparent from the following description, taken in conjunction with the accompanying drawings, in which.

DETAILED DESCRIPTION

Figure 1:
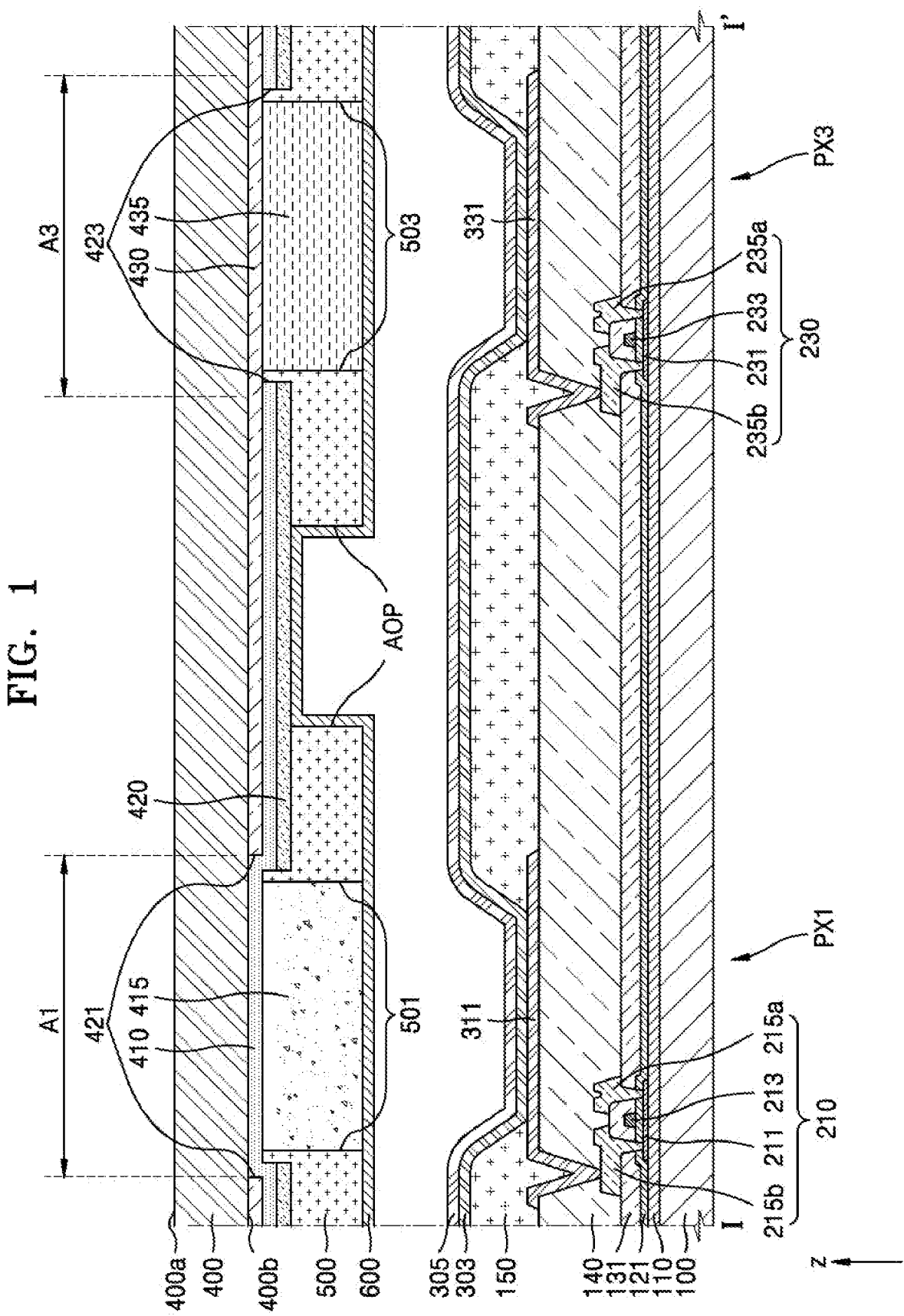
FIG. 1 is a schematic cross-sectional view of a portion of a display apparatus according to an embodiment.

Reference will now be made, in detail, to embodiments, examples of which are illustrated in the accompanying drawings. In this regard, the presented embodiments may have different forms and should not be construed as being limited to the descriptions set forth herein. Accordingly, embodiments are described below, by referring to the figures, to explain aspects and features of the present description.

Because the present description allows for various changes and numerous embodiments, only some embodiments will be illustrated in the drawings and described in the written description. Aspects and features of the present disclosure, and methods of accomplishing the same, will become apparent from the following detailed description of embodiments, taken in conjunction with the accompanying drawings. However, the present disclosure may have different forms and should not be construed as being limited to the descriptions set forth herein.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The x-axis, the y-axis, and the z-axis as shown in the drawings are not limited to three axes of the rectangular coordinate system and may be interpreted in a broader sense. For example, the x-axis, the y-axis, and the z-axis may be perpendicular to one another or may represent different directions that are not perpendicular to one another.

When an embodiment may be implemented differently, a certain process order may be performed differently from the described order. For example, two consecutively described processes may be performed substantially at the same time or performed in an order opposite to the described order.

Figure 2:
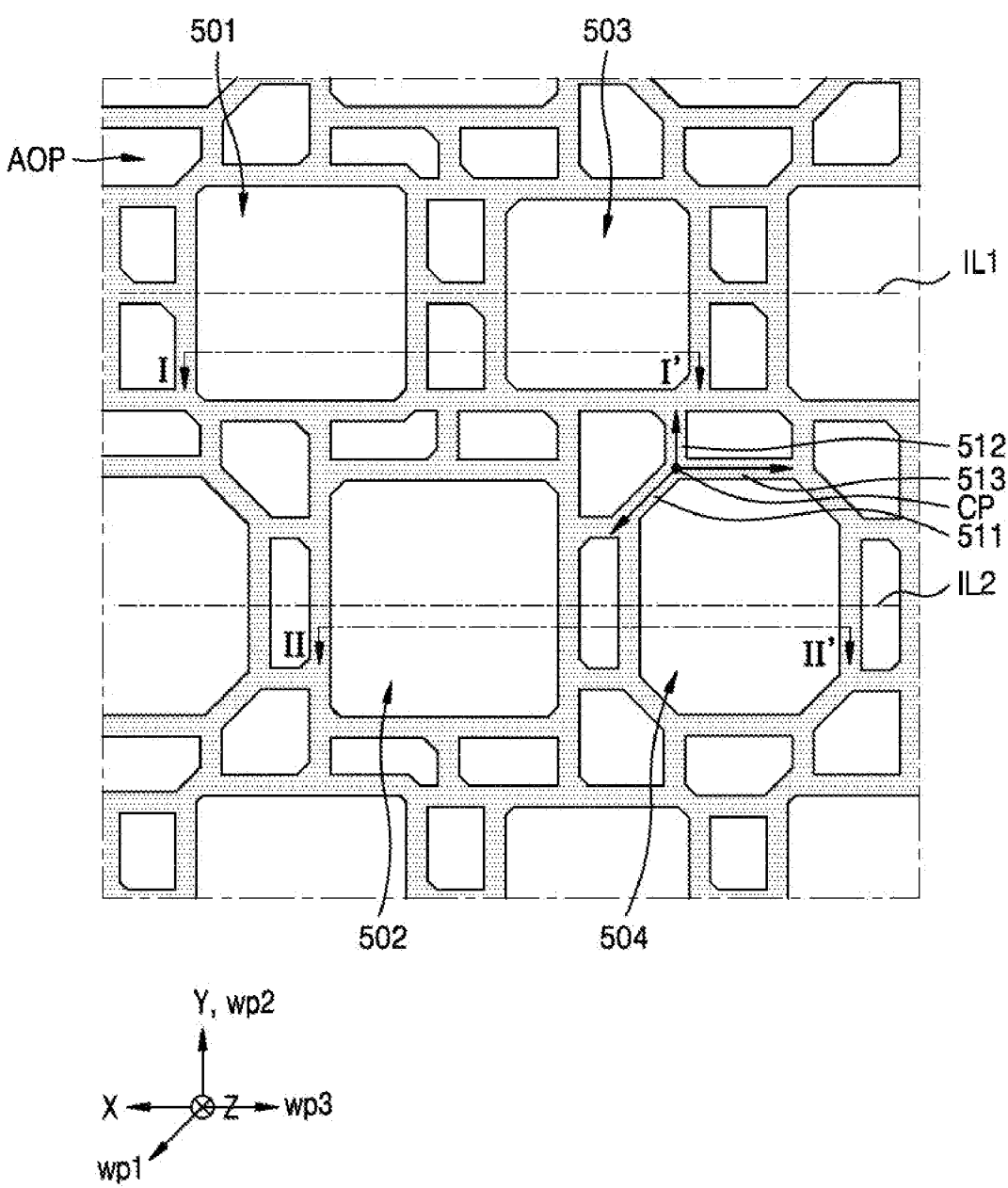
FIG. 2 is a schematic plan view of a portion of a display apparatus according to an embodiment.
Figure 3:
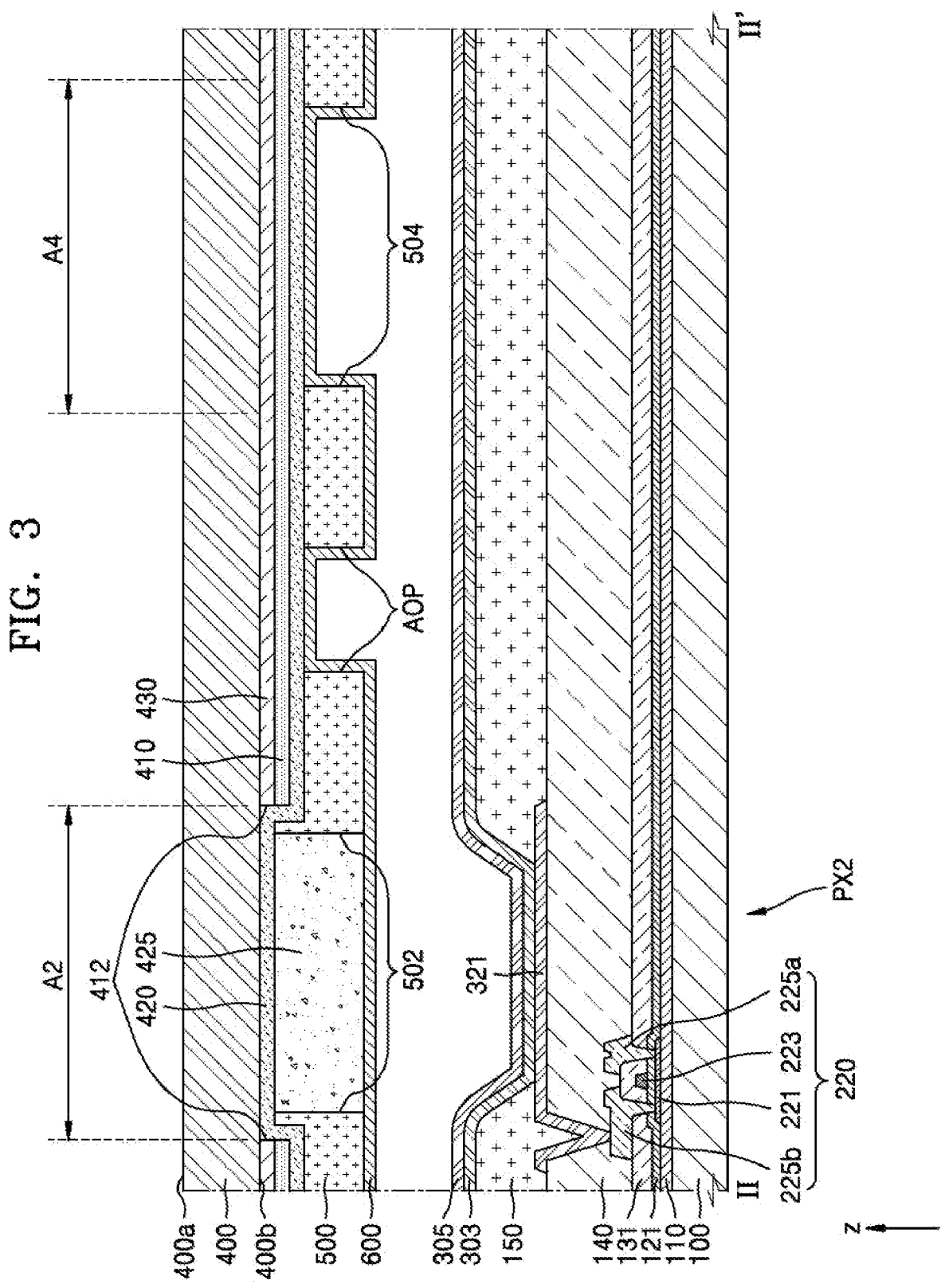
FIG. 3 is a schematic cross-sectional view of the display apparatus shown in FIG. 2 taken along the line II-II' in FIG. 2.

FIG. 1 is a schematic cross-sectional view of a portion of a display apparatus according to an embodiment. FIG. 2 is a schematic plan view of a portion of the display apparatus shown in FIG. 1. FIG. 3 is a schematic cross-sectional view of the display apparatus taken along the line II-II' of FIG. 2. Further, FIG. 1 is a schematic cross-sectional view of the display apparatus taken along the line I-I' of FIG. 2.

The display apparatus according to the present embodiment includes a second substrate (e.g., a lower substrate) 100, a first pixel electrode 311, a second pixel electrode 321, and a third pixel electrode 331 disposed above the second substrate 100, a pixel-defining layer 150, a first substrate (e.g., an upper substrate) 400, and a bank 500.

The second substrate 100 may include glass, metal, or polymer resin. The second substrate 100 may include, for example, polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. However, the second substrate 100 may be variously modified to have, for example, a multi-layer structure including two layers each including the above polymer resin and a barrier layer between the two layers and including an inorganic material (e.g., silicon oxide, silicon nitride, silicon oxynitride, etc.).

The first pixel electrode 311, the second pixel electrode 321, and the third pixel electrode 331 are on the second substrate 100. In addition to the first pixel electrode 311, the second pixel electrode 321, and the third pixel electrode 331, a first thin-film transistor 210, a second thin-film transistor 220, and a third thin-film transistor 230 electrically connected thereto may be above the second substrate 100. For example, as shown in FIGS. 1 and 3, the first pixel electrode 311 may be electrically connected to the first thin-film transistor 210, the second pixel electrode 321 may be electrically connected to the second thin-film transistor 220, and the third pixel electrode 331 may be electrically connected to the third thin-film transistor 230. The first pixel electrode 311, the second pixel electrode 321, and the third pixel electrode 331 may be on a planarization layer 140, described below, which is above the second substrate 100.

A buffer layer 110 including an inorganic material, such as silicon oxide, silicon nitride, and/or silicon oxynitride, may be disposed between the first to third thin-film transistors 210 to 230 and the second substrate 100. The buffer layer 110 may increase smoothness of (e.g., may planarize) an upper surface of the second substrate 100 and/or may prevent or reduce impurities from the second substrate 100, etc. from penetrating into a first semiconductor layer 211, a second semiconductor layer 221, and a third semiconductor layer 231.

The first thin-film transistor 210 configured to drive a first pixel PX1 may include the first semiconductor layer 211 including amorphous silicon, polycrystalline silicon, an organic semiconductor material, or an oxide semiconductor material, a first gate electrode 213, a first source electrode 215a, and a first drain electrode 215b. The first gate electrode 213 may have a single-layer structure or a multi-layer structure and, for example, may include a molybdenum (Mo) layer and/or an aluminum (Al) layer. The first gate electrode 213 may have a layered structure of Mo/Al/Mo. In another embodiment, the first gate electrode 213 may include a $TiN_x$ layer, an Al layer, and/or a Ti layer. The first source electrode 215a and the first drain electrode 215b may have a single-layer structure or a multi-layer structure and, for example, may include a Ti layer, an Al layer, and/or a Cu layer. The first source electrode 215a and the first drain electrode 215b may have a layered structure of Ti/Al/Ti.

A gate insulating layer 121 including an inorganic material, such as silicon oxide, silicon nitride, and/or silicon oxynitride, may be disposed between the first semiconductor layer 211 and the first gate electrode 213 to insulate the first semiconductor layer 211 and the first gate electrode 213 from each other. In addition, an interlayer insulating layer 131 including an inorganic material, such as silicon oxide, silicon nitride, and/or silicon oxynitride, may be disposed on the first gate electrode 213, and the first source electrode 215a and the first drain electrode 215b may be disposed on the interlayer insulating layer 131. Such insulating layers including an inorganic material may be formed through chemical vapor deposition (CVD) or atomic layer deposition (ALD). The same goes for embodiments described below and modifications thereof.

The second thin-film transistor 220 configured to drive a second pixel PX2 may include the second semiconductor layer 221, a second gate electrode 223, a second source electrode 225*a*, and a second drain electrode 225*b*. The third thin-film transistor 230 configured to drive a third pixel PX3 may include the third semiconductor layer 231, a third gate electrode 233, a third source electrode 235*a*, and a third drain electrode 235*b*. A structure of the second thin-film transistor 220 and a structure of the third thin-film transistor 230 are the same as or similar to a structure of the first thin-film transistor 210 configured to drive the first pixel PX1 and, thus, descriptions thereof are omitted.

The planarization layer 140 may be disposed on the first thin-film transistor 210, the second thin-film transistor 220, and the third thin-film transistor 230. For example, as shown in FIG. 1, when an organic light-emitting device including the first pixel electrode 311 is disposed over the first thin-film transistor 210, the planarization layer 140 may substantially planarize an upper portion of a protective layer covering the first thin-film transistor 210. The planarization layer 140 may include, for example, an organic material, such as acryl, benzocyclobutene (BCB), or hexamethyldisiloxane (HMDSO). Although it is shown in FIGS. 1 and 3 that the planarization layer 140 is a single layer, the planarization layer 140 may be variously modified to, for example, include a plurality of layers.

An organic light-emitting device including the first pixel electrode 311, an opposite electrode 305, and an intermediate layer 303 disposed therebetween and including an emission layer may be located in correspondence with (e.g., may be located or arranged to be aligned with or to correspond to) the first pixel PX1. As shown in FIG. 1, the first pixel electrode 311 contacts one of the first source electrode 215*a* and the first drain electrode 215*b* through a contact hole (e.g., a contact opening) formed in the planarization layer 140, etc. and, thus, is electrically connected to the first thin-film transistor 210. The first pixel electrode 311 may include a transmissive conductive layer formed of transmissive conductive oxide, such as ITO, $In_2O_3$, or IZO, and a reflective layer formed of metal, such as Al or Ag. The first pixel electrode 311 may have a three-layer structure of ITO/Ag/ITO.

Similarly, an organic light-emitting device including the second pixel electrode 321, the opposite electrode 305, and the intermediate layer 303 disposed therebetween and including an emission layer may be in the second pixel PX2. An organic light-emitting device including the third pixel electrode 331, the opposite electrode 305, and the intermediate layer 303 disposed therebetween and including an emission layer may be in the third pixel PX3. The second pixel electrode 321 contacts one of the second source electrode 225*a* and the second drain electrode 225*b* through a contact hole (e.g., a contact opening) formed in the planarization layer 140, etc. and, thus, is electrically connected to the second thin-film transistor 220. The third pixel electrode 331 contacts one of the third source electrode 235*a* and the third drain electrode 235*b* through a contact hole (e.g., a contact opening) formed in the planarization layer 140, etc. and, thus, is electrically connected to the third thin-film transistor 230. The above description of the first pixel electrode 311 may be applied to the second pixel electrode 321 and the third pixel electrode 331.

The intermediate layer 303 including an emission layer may be on the first pixel electrode 311 of the first pixel PX1, the second pixel electrode 321 of the second pixel PX2, and the third pixel electrode 331 of the third pixel PX3. In an embodiment, the intermediate layer 303 may be integrally formed as a single body (e.g., a continuous body) over the first pixel electrode 311, the second pixel electrode 321, and the third pixel electrode 331. In another embodiment, the intermediate layer 303 may be patterned (e.g., may be formed as separate bodies or portions) on the first pixel electrode 311, the second pixel electrode 321, and the third pixel electrode 331.

An emission layer included in the intermediate layer 303 may emit light having a wavelength in a first wavelength band. For example, the first wavelength band may be in a range of about 450 nm to about 495 nm.

The intermediate layer 303 may also include a hole injection layer, a hole transport layer, and/or an electron transport layer in addition to the emission layer. Some of the layers included in the intermediate layer 303 may be integrally formed as a single body over the first to third pixel electrodes 311 to 331, and the other layers may be patterned on the first pixel electrode 311, the second pixel electrode 321, and the third pixel electrode 331.

For example, a hole injection layer, a hole transport layer, an electron injection layer, and/or an electron transport layer may be disposed under and/or on the emission layer and may be integrally formed as a single body over the first pixel electrode 311, the second pixel electrode 321, and the third pixel electrode 331.

The hole injection layer may facilitate injection of holes and may include at least one selected from the group including HATCN, copper phthalocyanine (CuPc), poly(3, 4)-ethylenedioxythiophene (PEDOT), polyaniline (PANI), and N, N-dinaphthyl-N,N'-diphenylbenzidine (NPD), but embodiments of the present disclosure are not limited thereto.

The hole transport layer may include a triphenylamine derivative having high hole mobility and excellent stability, such as N,N'-diphenyl-N,N'-bis(3-methylphenyl)-1,1'-biphenyl-4,4'-diamine (TPD), or N,N'-di(naphthalen-1-yl)-N, N'-diphenyl-benzidine (NPB), as a host of the hole transport layer.

The electron transport layer may facilitate transport of electrons and may include at least one selected from the group including tris(8-hydroxyquinolino)aluminum (Alq3), PBD, TAZ, spiro-PBD, BAlq, lithium quinolate (Liq), BMB-3T, PF-6P, TPBI, COT, and SAlq, but embodiments of the present disclosure are not limited thereto.

The electron injection layer may facilitate injection of electrons and may include Yb, tris(8-hydroxyquinolino) aluminum (Alq3), PBD, TAZ, spiro-PBD, BAlq, or SAlq, but embodiments of the present disclosure are not limited thereto.

Similar to the intermediate layer 303, the opposite electrode 305 on the intermediate layer 303 may be integrally formed as a single body over the first to third pixel electrodes 311 to 331. The opposite electrode 305 may include a transmissive conductive layer formed of ITO, $In_2O_3$, or IZO, and a semi-transmissive layer including metal, such as Al, Li, Mg, Yb, or Ag. For example, the opposite electrode 305 may be a semi-transmissive layer including MgAg, AgYb, Yb/MgAg, or Li/MgAg.

The pixel-defining layer 150 may be disposed on the planarization layer 140. The pixel-defining layer 150 has an opening corresponding to each pixel. For example, the pixel-defining layer 150 covers edges of each of the first pixel electrode 311, the second pixel electrode 321, and the third pixel electrode 331 and has an opening exposing a central portion of the first pixel electrode 311, an opening exposing a central portion of the second pixel electrode 321, and an opening exposing a central portion of the third pixel electrode 331. As such, the pixel-defining layer 150 may define the pixels. In addition, as shown in FIGS. 1 and 3, the pixel-defining layer 150 may prevent an arc (e.g., or short) or the like at the edges of the first pixel electrode 311, the second pixel electrode 321, and the third pixel electrode 331 by increasing a distance between the opposite electrode 305 and the edges of each of the first pixel electrode 311, the second pixel electrode 321, and the third pixel electrode 331. The pixel-defining layer 150 may include, for example, an organic material, such as polyimide or HMDSO.

The first substrate 400 may be disposed over the second substrate 100 such that the first pixel electrode 311, the second pixel electrode 321, the third pixel electrode 331, etc. may be between the first substrate 400 and the second substrate 100. The first substrate 400 may include glass or polymer resin. The first substrate 400 may include, for example, polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The first substrate 400 may be variously modified, for example, to have a multi-layer structure including two layers each including the above polymer resin and a barrier layer between the two layers and including an inorganic material (e.g., silicon oxide, silicon nitride, silicon oxynitride, etc.). In an embodiment, the first substrate 400 may be flexible or bendable.

The bank 500 is on an upper surface 400*b* of the first substrate 400 in a direction toward (e.g., a direction facing) the second substrate 100 (e.g., in a −z direction). For example, the bank 500 is between the first substrate 400 and the second substrate 100. The bank 500 may include first wells (e.g., grooves or openings) 501, second wells 502, third wells 503, fourth wells 504, and auxiliary wells AOP. In an embodiment, the first wells 501, the second wells 502, the third wells 503, the fourth wells 504, and the auxiliary wells AOP may pass through the bank 500. For example, the bank 500 may include partition walls defining the first wells 501, the second wells 502, the third wells 503, the fourth wells 504, and the auxiliary wells AOP.

The first well 501 in the bank 500 corresponds to an opening in the pixel-defining layer 150 exposing the first pixel electrode 311, the second well 502 in the bank 500 corresponds to an opening in the pixel-defining layer 150 exposing the second pixel electrode 321, and the third well 503 in the bank 500 corresponds to an opening in the pixel-defining layer 150 exposing the third pixel electrode 331. For example, when viewed in a direction perpendicular to a lower surface 400*a* of the first substrate 400 (e.g., a z-axis direction), the first well 501 in the bank 500 overlaps an opening in the pixel-defining layer 150 exposing the first pixel electrode 311, the second well 502 in the bank 500 overlaps an opening in the pixel-defining layer 150 exposing the second pixel electrode 321, and the third well 503 in the bank 500 overlaps an opening in the pixel-defining layer 150 exposing the third pixel electrode 331. Thus, when viewed in the direction perpendicular to the lower surface 400*a* of the first substrate 400 (e.g., the z-axis direction), a shape of an edge of each of the first to third wells 501 to 503 in the bank 500 may be identical or similar to that of an edge of a corresponding opening in the pixel-defining layer 150. Accordingly, the first well 501 in the bank 500 may correspond to the first pixel electrode 311, the second well 502 of the bank 500 may correspond to the second pixel electrode

321, and the third well 503 in the bank 500 may correspond to the third pixel electrode 331.

The fourth wells 504 in the bank 500 may not correspond to openings in the pixel-defining layer 150 exposing the first to third pixel electrodes 311 to 331. For example, when viewed in the direction perpendicular to the lower surface 400*a* of the first substrate 400 (e.g., the z-axis direction), the fourth wells 504 of the bank 500 may be apart from (e.g., may be offset from or spaced horizontally apart from) openings in the pixel-defining layer 150 exposing the first to third pixel electrodes 311 to 331. That is, the fourth wells 504 of the bank 500 may not overlap openings in the pixel-defining layer 150 exposing the first to third pixel electrodes 311 to 331.

In another embodiment, a fourth pixel electrode and a fourth thin-film transistor electrically connected thereto may be above the second substrate 100. A fourth pixel corresponding to the fourth pixel electrode may emit light having a wavelength in a wavelength band different from those of the first pixel PX1, the second pixel PX2, and the third pixel PX3. In such an embodiment, the fourth wells 504 in the bank 500 may correspond to an opening in the pixel-defining layer 150 exposing the fourth pixel electrode. That is, the fourth wells 504 in the bank 500 may overlap an opening in the pixel-defining layer 150 exposing the fourth pixel electrode.

The auxiliary wells AOP may be arranged between the first wells 501, the second wells 502, the third wells 503, and the fourth wells 504. For example, the first wells 501, the second wells 502, the third wells 503, and the fourth wells 504 may be apart from (e.g., spaced apart from or separated from) one another, and the auxiliary wells AOP may be arranged to surround (e.g., to extend around a periphery of or surround in a plan view) each of the first wells 501, the second wells 502, the third wells 503, and the fourth wells 504.

The bank 500 may include various materials, for example, an inorganic material, such as silicon oxide, silicon nitride, and/or silicon oxynitride. The bank 500 may include a photoresist material, and thus, the bank 500 may be easily formed by processes, such as exposure and development. In an embodiment, an upper surface of the bank 500 may be hydrophobic. The upper surface of the bank 500 may be coated with a hydrophobic material or may be modified to have hydrophobicity by plasma surface treatment. In another embodiment, upper and side surfaces of the bank 500 may be hydrophobic. In the present description, the upper surface of the bank 500 may be a surface in a direction toward (e.g., facing) the second substrate 100 (e.g., the −z direction). Hereinafter, the upper surface of the bank 500 and upper surfaces of the partition walls refer to the surface in a direction toward the second substrate 100 (e.g., the −z direction).

A first quantum dot layer 415 may be in the first wells 501 in the bank 500. The first quantum dot layer 415 may overlap the first pixel electrode 311 when viewed in the direction perpendicular to the lower surface 400*a* of the first substrate 400 (e.g., the z-axis direction). The first quantum dot layer 415 may convert light having a wavelength in the first wavelength band into light having a wavelength in a second wavelength band as it passes through the first quantum dot layer 415. The second wavelength band may be in a range of, for example, about 630 nm to about 780 nm. However, embodiments of the present disclosure are not limited thereto, and a wavelength band to which a wavelength to be converted by the first quantum dot layer 415 belongs and a wavelength band to which a wavelength after conversion belongs may be suitably modified.

The first quantum dot layer 415 may have a form in which quantum dots are dispersed in a resin. In the present disclosure, quantum dots refer to crystals of a semiconductor compound and may include any material capable of emitting light of various emission wavelengths according to sizes of the crystals. A diameter of the quantum dots may be in a range of, for example, about 1 nm to about 10 nm.

Quantum dots may be synthesized by a wet chemical process, a metal organic chemical vapor deposition (MOCVD) process, a molecular beam epitaxy (MBE) process, or a similar process. The wet chemical process is a method of growing quantum dot particle crystals after mixing an organic solvent with a precursor material. In the wet chemical process, the organic solvent naturally acts as a dispersant coordinated on surfaces of quantum dot crystals when the crystals are grown and controls the growth of the crystals, and thus, the wet chemical process is easier than a vapor deposition method, such as MOCVD or MBE. In addition, the wet chemical process is a low-cost process that allows controlled growth of quantum dot particles.

The quantum dots may include a group III-VI semiconductor compound, a group II-VI semiconductor compound, a group III-V semiconductor compound, a group semiconductor compound, a group IV-VI semiconductor compound, a group IV element or compound, or any combination thereof.

Examples of the group III-VI semiconductor compound may include a binary compound, such as GaS, GaSe, $Ga_2Se_3$, GaTe, InS, InSe, $In_2Se_3$, or InTe, a ternary compound, such as $InGaS_3$ or $InGaSe_3$, or any combination thereof.

Examples of the group II-VI semiconductor compound may include a binary compound, such as CdS, CdSe, CdTe, ZnS, ZnSe, ZnTe, ZnO, HgS, HgSe, HgTe, MgSe, or MgS, a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS, a quaternary compound, such as CdZnSeS, CdZnSeTe, CdZnSTe, CdHgSeS, CdHgSeTe, CdHgSTe, HgZnSeS, HgZnSeTe, or HgZnSTe, or any combination thereof.

Examples of the group III-V semiconductor compound may include a binary compound, such as GaN, GaP, GaAs, GaSb, AlN, AlP, AlAs, AlSb, InN, InP, InAs, or InSb, a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or GaAlNP, a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb, or any combination thereof. The group III-V semiconductor compound may further include a group II element. Examples of the group III-V semiconductor compound further including a group II element may include InZnP, InGaZnP, or InAlZnP.

Examples of the group semiconductor compound may include a ternary compound, such as AgInS, $AgInS_2$, CuInS, $CuInS_2$, $CuGaO_2$, $AgGaO_2$, or $AgAlO_2$, or any combination thereof.

Examples of the group IV-VI semiconductor compound may include a binary compound, such as SnS, SnSe, SnTe, PbS, PbSe, or PbTe, a ternary compound, such as SnSeS, SnSeTe, SnSTe, PbSeS, PbSeTe, PbSTe, SnPbS, SnPbSe, or SnPbTe, a quaternary compound, such as SnPbSSe, SnPbSeTe, or SnPbSTe, or any combination thereof.

Examples of the group IV element or compound may include a single-element compound, such as Si or Ge, a binary compound, such as SiC or SiGe, or any combination thereof.

Elements included in a multi-element compound, such as a binary compound, a ternary compound, and a quaternary compound, may be in particles at a uniform concentration or a non-uniform concentration.

Quantum dots may have a single structure in which a concentration of each element included in the quantum dots is uniform or may have a core-shell dual structure. For example, a material included in a core and a material included in a shell may be different from each other. The shell of quantum dots may act as a protective layer for maintaining semiconductor characteristics by preventing chemical degeneration of the core and/or a charging layer for imparting electrophoretic characteristics to quantum dots. The shell may have a single-layer or multi-layer structure. An interface between the core and the shell may have a concentration gradient in which a concentration of an element in the shell decreases toward a center thereof.

Examples of the shell of quantum dots may include metal or non-metal oxide, a semiconductor compound, or a combination thereof. Examples of the metal or non-metal oxide may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, a ternary compound, such as $MgAl_2O_4$, $CoFe_2O_4$, $NiFe_2O_4$, or $CoMn_2O_4$, or any combination thereof. Examples of the semiconductor compound may include, as described above, a group III-VI semiconductor compound, a group II-VI semiconductor compound, a group III-V semiconductor compound, a group I-III-VI semiconductor compound, a group IV-VI semiconductor compound, or any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

Quantum dots may have a full width of half maximum (FWHM) of an emission wavelength spectrum of about 45 nm or less, about 40 nm or less, or about nm or less, and color purity or color reproducibility may be improved in this range. In addition, a viewing angle of light may be improved because light emitted through (or by) the quantum dots is emitted in all directions.

The quantum dots may have, for example, spherical, pyramidal, multi-arm, or cubic nanoparticles, nanotubes, nanowires, nanofibers, or nanoplatelet particle shapes.

An energy band gap may be adjusted by adjusting a size of the quantum dots, and thus, light in various wavelength bands may be obtained through a quantum dot emission layer. Accordingly, a light-emitting element emitting light of various wavelengths may be implemented by using quantum dots having different sizes from each other. For example, a size of quantum dots may be selected to emit red light, green light, and/or blue light. In addition, a size of quantum dots may be configured to emit white light by combining quantum dots of various sizes.

The first quantum dot layer 415 may include a scatterer. Incident light may be scattered by the scatterer included in the first quantum dot layer 415, and thus, the incident light may be efficiently converted by the quantum dots in the first quantum dot layer 415. Any material capable of partially scattering transmitted light by forming an optical interface between a scatterer and a transmissive resin may be used as the scatterer. For example, the scatterer may be a metal oxide particle or an organic particle. Examples of metal oxide to be used as the scatterer may include titanium oxide (e.g., $TiO_2$), zirconium oxide (e.g., $ZrO_2$), aluminum oxide (e.g., $Al_2O_3$), indium oxide (e.g., $In_2O_3$), zinc oxide (e.g., $ZnO$), or tin oxide (e.g., $SnO_2$), and examples of an organic material to be used as the scatterer may include acryl-based resin or urethane-based resin. The scatterer may scatter light in various directions regardless of an angle of incidence of the light without substantially converting a wavelength of incident light. Thus, the scatterer may improve side visibility of the display apparatus (e.g., may improve the viewing angle of the display apparatus). In addition, the scatterer included in the first quantum dot layer 415 may increase a probability that light incident on the first quantum dot layer 415 meets (e.g., is incident on) the quantum dots, thereby increasing light conversion efficiency.

Any material that has excellent dispersion characteristics with respect to the scatterer and is transmissive may be used as a resin to be included in the first quantum dot layer 415. For example, polymer resin, such as acryl-based resin, imide-based resin, epoxy-based resin, BCB, or HMDSO, may be used as a material for forming the first quantum dot layer 415. The material for forming the first quantum dot layer 415 may be located in the first well 501 in the bank 500 overlapping the first pixel electrode 311 by using an inkjet printing method.

A second quantum dot layer 425 may be in the second wells 502 in the bank 500. The second quantum dot layer 425 may overlap the second pixel electrode 321 when viewed in the direction perpendicular to the lower surface 400a of the first substrate 400 (e.g., the z-axis direction). The second quantum dot layer 425 may convert light having a wavelength in the first wavelength band into light having a wavelength in a third wavelength band as it passes through the second quantum dot layer 425. The third wavelength band may be in a range of, for example, about 495 nm to about 570 nm. However, embodiments of the present disclosure are not limited thereto, and a wavelength band to which a wavelength to be converted by the second quantum dot layer 425 belongs and a wavelength band to which a wavelength after conversion belongs may be suitably varied.

The second quantum dot layer 425 may have a form in which quantum dots are dispersed in a resin. A diameter of the quantum dots may be in a range of, for example, about 1 nm to about 10 nm. The above description of the quantum dots included in the first quantum dot layer 415 may be applied to the quantum dots included in the second quantum dot layer 425, and thus, a description of the quantum dots included in the second quantum dot layer 425 is omitted.

The second quantum dot layer 425 may include a scatterer. Light may be scattered by the scatterer included in the second quantum dot layer 425, and thus, the incident light may be efficiently converted by the quantum dots in the second quantum dot layer 425. Any material capable of partially scattering transmitted light by forming an optical interface between a scatterer and a transmissive resin may be used as the scatterer. For example, the scatterer may be a metal oxide particle or an organic particle. Metal oxide to be used as the scatterer and an organic material to be used as the scatterer are the same as those described above. The scatterer may scatter light in various directions regardless of an angle of incidence of the light without substantially converting a wavelength of incident light. Thus, the scatterer may improve side visibility of the display apparatus. In addition, the scatterer included in the second quantum dot layer 425 may increase a probability that light incident on the second quantum dot layer 425 meets (e.g., is incident on) the quantum dots, thereby increasing light conversion efficiency.

Any material that has excellent dispersion characteristics with respect to the scatterer and is transmissive may be used as a resin to be included in the second quantum dot layer 425. For example, polymer resin, such as acryl-based resin, imide-based resin, epoxy-based resin, BCB, or HMDSO, may be used as a material for forming the second quantum dot layer 425. The material for forming the second quantum dot layer 425 may be located in the second well 502 in the bank 500 overlapping the second pixel electrode 321 by using an inkjet printing method.

In the third pixel PX3, light having a wavelength in the first wavelength band, generated in the intermediate layer 303 including an emission layer, is emitted to the outside through the first substrate 400 without wavelength conversion. Accordingly, the third pixel PX3 has no corresponding quantum dot layer. Instead, a transmissive layer 435 including a transmissive resin may be in the third well 503 in the bank 500 overlapping the third pixel electrode 331. The transmissive layer 435 may include acryl, BCB, or HMDSO. In addition, the transmissive layer 435 may include a scatterer. In some embodiments, the transmissive layer 435 may be omitted from the third well 503 in the bank 500.

As shown in FIG. 3, neither a quantum dot layer nor a transmissive layer may be present in the fourth well 504 in the bank 500.

In another embodiment, when the fourth wells 504 in the bank 500 correspond to openings in the pixel-defining layer 150 exposing the fourth pixel electrode, a third quantum dot layer for converting light having a wavelength in the first wavelength band into light having a wavelength in a fourth wavelength band or a transmissive layer may be present in the fourth well 504. The third quantum dot layer may have a form in which quantum dots are dispersed in a resin. In addition, the third quantum dot layer may include a scatterer. Hereinafter, an embodiment in which the fourth well 504 has neither a quantum dot layer nor a transmissive layer therein, as shown in FIG. 3, will be described.

As described above, the first quantum dot layer 415 and the second quantum dot layer 425 may be formed by an inkjet printing method. For example, after the bank 500 including the first well 501, the second well 502, the third well 503, and the fourth well 504 is formed over the first substrate 400, a material for forming the first quantum dot layer 415 may be dotted in (e.g., printed in) the first well 501 by using an inkjet printing method, and a material for forming the second quantum dot layer 425 may be dotted in the second well 502 by using an inkjet printing method, and thus, the first quantum dot layer 415 and the second quantum dot layer 425 may be formed.

In this regard, during a process of dotting (or printing) a material for forming the first quantum dot layer 415 by using an inkjet printing method, the material may not be located in the first well 501, and during a process of dotting a material for forming the second quantum dot layer 425, the material may not be located in the second well 502. In this case, to decrease a probability that a material for forming the first quantum dot layer 415 is located in the second well 502 or the third well 503 and to decrease a probability that a material for forming the second quantum dot layer 425 is located in the first well 501 or the third well 503, as shown in FIGS. 1 to 3, a display apparatus according to the present embodiment includes, in the bank 500, the auxiliary wells AOP surrounding the first well 501, the second well 502, the third well 503, and the fourth well 504.

Accordingly, even when, during a process of dotting a material for forming the first quantum dot layer 415 by using an inkjet printing method, the material is not located in the first well 501, the material may be located in (e.g., may flow into) the auxiliary well AOP to decrease a probability that the material is located in (e.g., flows into) the second well 502 or the third well 503. In addition, even when, during a process of dotting a material for forming the second quantum dot layer 425 by using an inkjet printing method, the material is not located in the second well 502, the material may be located in the auxiliary well AOP to decrease a probability that the material is located in the first well 501 or the third well 503.

For example, the first well 501 and the third well 503 may be apart from each other along a first imaginary line IL1 (see FIG. 2), the second well 502 and the fourth well 504 may be apart from each other along a second imaginary line IL2 parallel to the first imaginary line IL1, and the auxiliary wells AOP may be arranged among (e.g., between) the first well 501, the second well 502, the third well 503, and the fourth well 504. The first well 501 and the third well 503 may be alternately arranged along the first imaginary line IL1, and the second well 502 and the fourth well 504 may be alternately arranged along the second imaginary line IL2.

A center of the first well 501 and a center of the third well 503 on the first imaginary line IL1 may correspond between (e.g., may be offset from) a center of the second well 502 and a center of the fourth well 504 on the second imaginary line IL2 closest to the first imaginary line IL1. For example, the auxiliary wells AOP arranged between the first well 501 and the third well 503 may substantially correspond to (e.g., may be aligned with) a center of the second well 502 or a center of the fourth well 504 (e.g., aligned in a direction perpendicular to an extension direction of the first and second imaginary lines IL1 and IL2). Similarly, the auxiliary wells AOP arranged between the second well 502 and the fourth well 504 may substantially correspond to a center of the first well 501 or the third well 503. Thus, an overall structure of the bank 500 may remain rigid.

As shown in FIG. 2, when viewed in a direction perpendicular to the first substrate 400 (e.g., a z direction), the first well 501, the second well 502, the third well 503, the fourth well 504, and each of the auxiliary wells AOP may have a polygonal shape. In an embodiment, the first well 501, the second well 502, and the third well 503 may have a chamfered quadrangular shape, and the fourth well 504 may have an octagonal shape. Each of the auxiliary wells AOP may be arranged among the first well 501, the second well 502, the third well 503, and the fourth well 504 and may have various polygonal shapes.

The bank 500 may include partition walls defining the first well 501, the second well 502, the third well 503, the fourth well 504, and the auxiliary wells AOP. The partition walls defining the first well 501, the second well 502, the third well 503, and the fourth well 504 may constitute a portion of the partition walls defining the auxiliary wells AOP. In other words, the first well 501, the second well 502, the third well 503, and the fourth well 504 may share the same partition walls as the auxiliary wells AOP adjacent thereto.

A point at which partition walls extending in different directions meet one another may be defined as a cross point CP. In this regard, FIG. 2 shows that a first partition wall 511 extending in a first direction wp1, a second partition wall 512 extending in a second direction wp2, and a third partition wall 513 extending in a third direction wp3 meet one another at one cross point CP. In an embodiment, the number of partition walls that meet each other at every cross point CP of the bank 500 may be three or less. For example, the number of wells sharing (e.g., simultaneously sharing) one point on the partition walls from among the first well 501, the second well 502, the third well 503, the fourth well 504, and the auxiliary wells AOP may be three or less.

As shown in FIGS. 1 and 3, a color filter layer may be between the upper surface 400*b* of the first substrate 400 in a direction toward the second substrate 100 (e.g., the −z direction) and the first quantum dot layer 415, the second quantum dot layer 425, and the transmissive layer 435. For example, a first color filter layer 410 may be between the first substrate 400 and the first quantum dot layer 415, a second color filter layer 420 may be between the first substrate 400 and the second quantum dot layer 425, and a third color filter layer 430 may be between the first substrate 400 and the transmissive layer 435. The first color filter layer 410 may be a layer that transmits light having only a wavelength in a range of about 630 nm to about 780 nm. The second color filter layer 420 may be a layer that transmits light having only a wavelength in a range of about 495 nm to about 570 nm. The third color filter layer 430 may be a layer that transmits light having only a wavelength in a range of about 450 nm to about 495 nm.

The first to third color filter layers 410 to 430 may increase color purity of light emitted to the outside, thereby increasing the quality of a displayed image. In addition, the first to third color filter layers 410 to 430 may reduce a ratio of external light that may be incident from the outside to the display apparatus and reflected by the first to third pixel electrodes 311 to 331 to be emitted back to the outside, thereby reducing external light reflection. A black matrix may be between the first to third color filter layers 410 to 430.

As shown in FIG. 1, the second color filter layer 420 and the third color filter layer 430 have an opening 421 exposing a first area A1. The opening 421 may define an area of the first pixel PX1. The first color filter layer 410 fills at least the opening 421. The first color filter layer 410 and the second color filter layer 420 have an opening 423 exposing a third area A3. The opening 423 may define an area of the third pixel PX3. As shown in FIG. 3, the first color filter layer 410 and the third color filter layer 430 have an opening 412 exposing a second area A2. The opening 412 may define an area of the second pixel PX2. The second color filter layer 420 fills at least the opening 412.

A portion at where the first color filter layer 410 and the third color filter layer 430 overlap each other, a portion where the second color filter layer 420 and the third color filter layer 430 overlap each other, and a portion where the first color filter layer 410 and the second color filter layer 420 overlap each other may act as a black matrix. In some embodiments, at an area other than the opening 421 exposing the first area A1, the opening 412 exposing the second area A2, and the opening 423 exposing the third area A3, the third color filter layer 430, the first color filter layer 410, and the second color filter layer 420 may be sequentially stacked in a direction from the first substrate 400 to the second substrate 100 (e.g., the −z direction).

Although it is shown in FIG. 3 that the first color filter layer 410, the second color filter layer 420, and the third color filter layer 430 overlap one another in the fourth area A4 corresponding to the fourth well 504, as described above, when the fourth well 504 corresponds to the fourth pixel, at least one of the first to third color filter layers 410 to 430 may include an opening exposing the fourth area A4. In another embodiment, the color filter layer may further include a fourth color filter layer between the first substrate 400 and a third quantum dot layer, and the first to third color filter layers 410 to 430 may have an opening exposing the fourth area A4.

To protect the first quantum dot layer 415, the second quantum dot layer 425, and the transmissive layer 435, as shown in FIGS. 1 and 3, a protective layer 600 may be located on a surface of the first quantum dot layer 415, the second quantum dot layer 425, and the transmissive layer 435 facing toward the second substrate 100. The protective layer 600 may include an inorganic material, such as silicon oxide or silicon nitride. For example, the protective layer 600 may have a two-layer structure including a silicon oxide layer and a silicon nitride layer. In an embodiment in which the fourth well 504 and the auxiliary well AOP are devoid of material, as shown in FIGS. 1 and 3, the protective layer 600 may cover inner side surfaces and a bottom surface of each of the fourth well 504 and the auxiliary well AOP.

A filler may fill between the first substrate 400 and the second substrate 100. For example, in the display apparatus shown in FIG. 1, the filler may fill between the protective layer 600 and the opposite electrode 305. The filler may include a transmissive material. For example, the filler may include acryl-based resin or epoxy-based resin.

Figure 4:
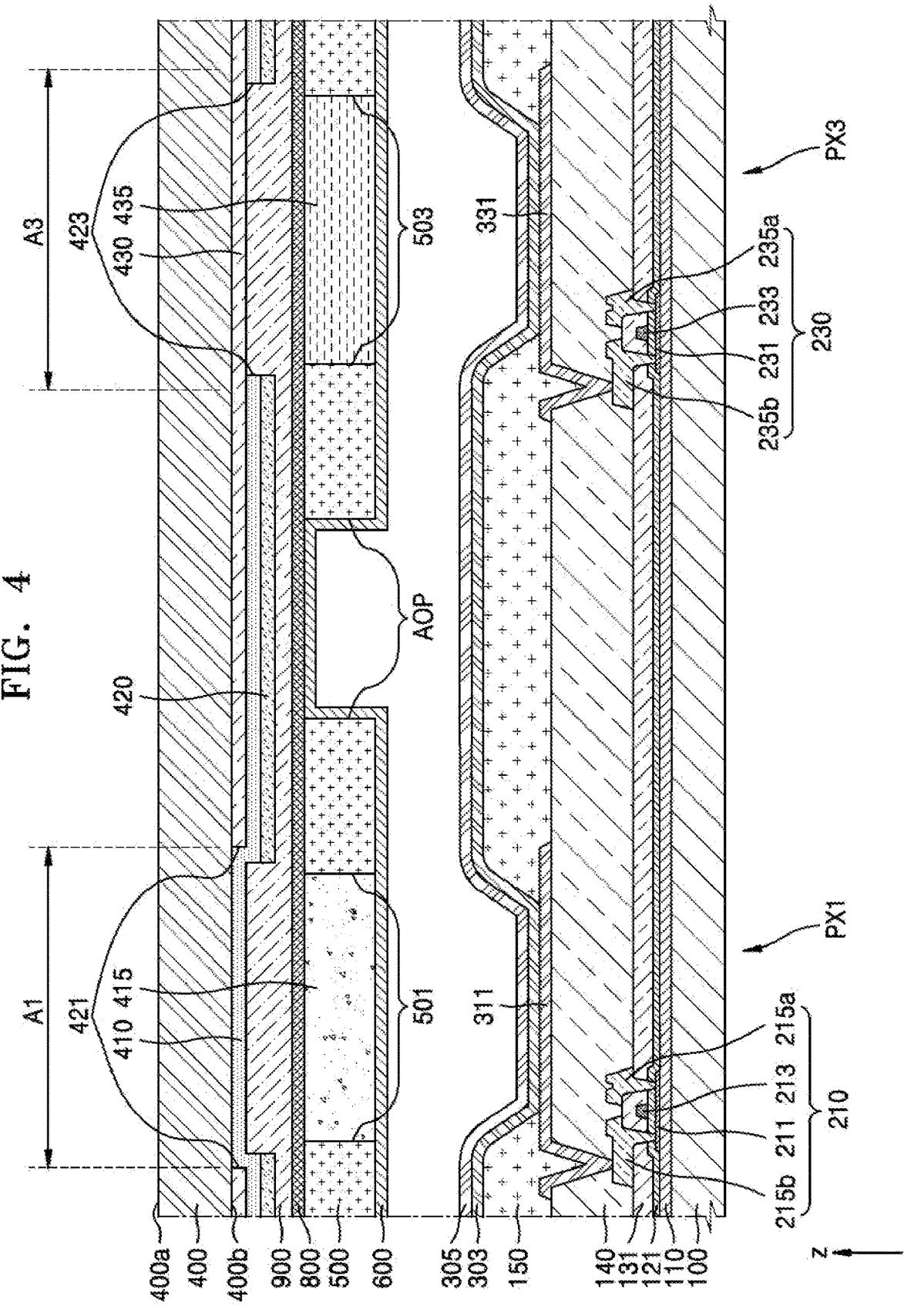
FIGS. 4 and 5 are schematic cross-sectional views of a portion of a display apparatus according to an embodiment.
Figure 5:
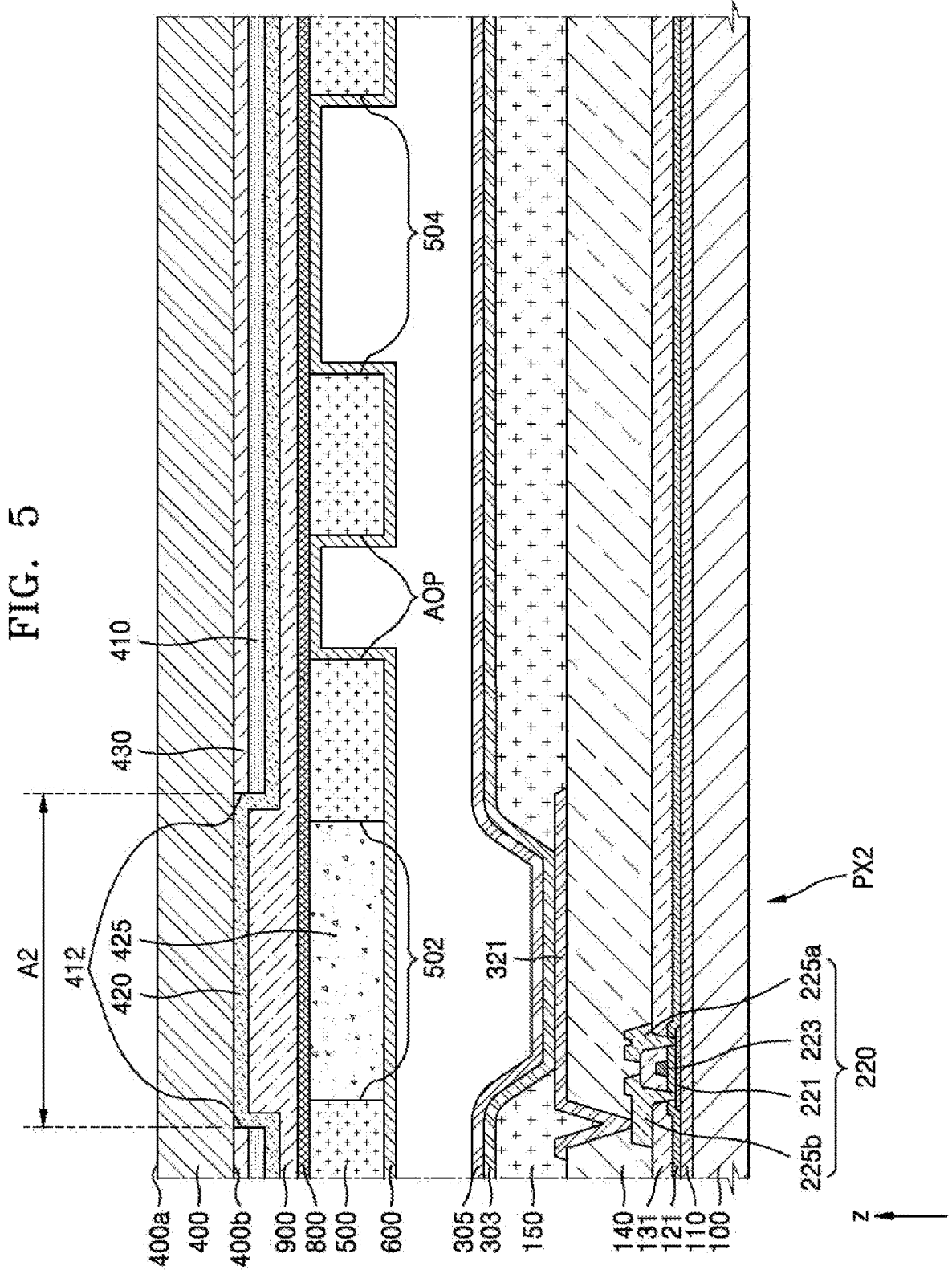

FIGS. 4 and 5 are schematic cross-sectional views of a portion of a display apparatus according to an embodiment. The embodiment shown in FIGS. 4 and 5 is similar to the embodiment shown in FIGS. 1 and 3 but includes a low refractive index layer 900 provided between each of the first quantum dot layer 415, the second quantum dot layer 425, the transmissive layer 435, and the bank 500 and the first color filter layer 410, the second color filter layer 420, and the third color filter layer 430. In addition, an additional protective layer 800 is provided between each of the first quantum dot layer 415, the second quantum dot layer 425, the transmissive layer 435, and the bank 500 and the low refractive index layer 900.

The low refractive index layer 900 may include an organic material having a low refractive index and may increase light emission efficiency in which light passing through the first quantum dot layer 415 and the second quantum dot layer 425 is emitted to the outside through the first substrate 400. The additional protective layer 800 may include silicon oxide or silicon nitride and may protect the first quantum dot layer 415 and the second quantum dot layer 425 by preventing external impurities from penetrating into the first quantum dot layer 415 and the second quantum dot layer 425 together with the protective layer 600. In an embodiment in which the fourth well 504 or the auxiliary well AOP are devoid of material, the protective layer 600 may contact the additional protective layer 800 in the fourth well 504 and the auxiliary well AOP.

The first substrate 400 and the second substrate 100 may each be formed (e.g., may be separately formed) and may configure one display apparatus through a bonding process. In this regard, when a material for forming the first quantum dot layer 415 and the second quantum dot layer 425 is erroneously deposited during an inkjet printing process and, thus, remains on upper surfaces of the partition walls of the bank 500, a defect may occur in the protective layer 600 or elements on the second substrate 100 may be damaged. According to embodiments described below, a material for forming the first quantum dot layer 415 and the second quantum dot layer 425 may not be on (or may not remain on) an upper surface of the cross point CP at where partition walls extending in different directions meet one another.

Figure 6:
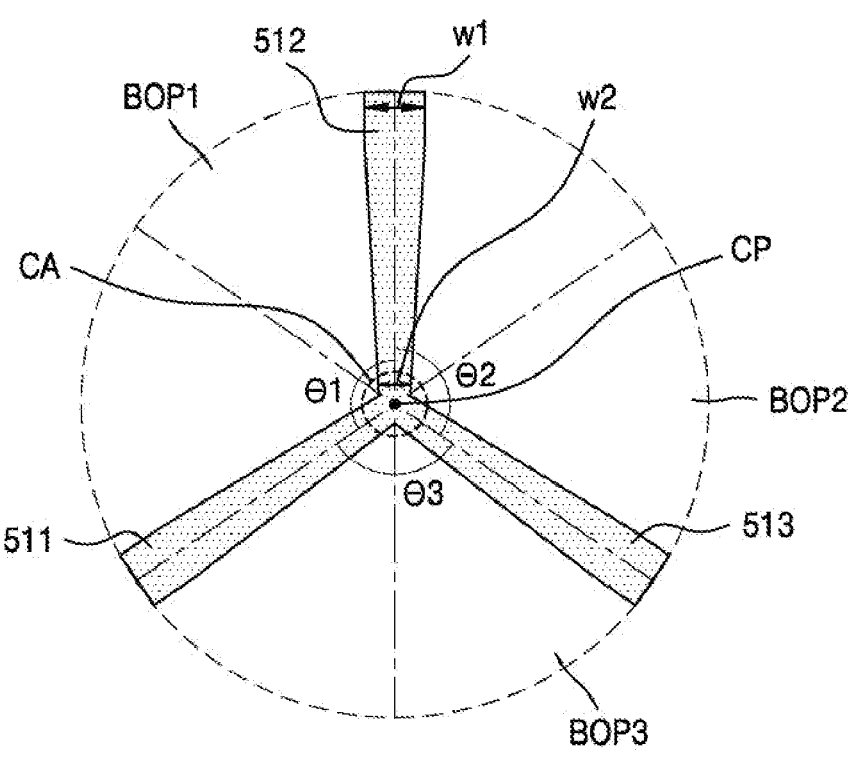
FIGS. 6 and 7 are schematic plan views of a portion of a display apparatus according to embodiments.
Figure 6:
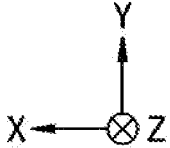
Figure 7:
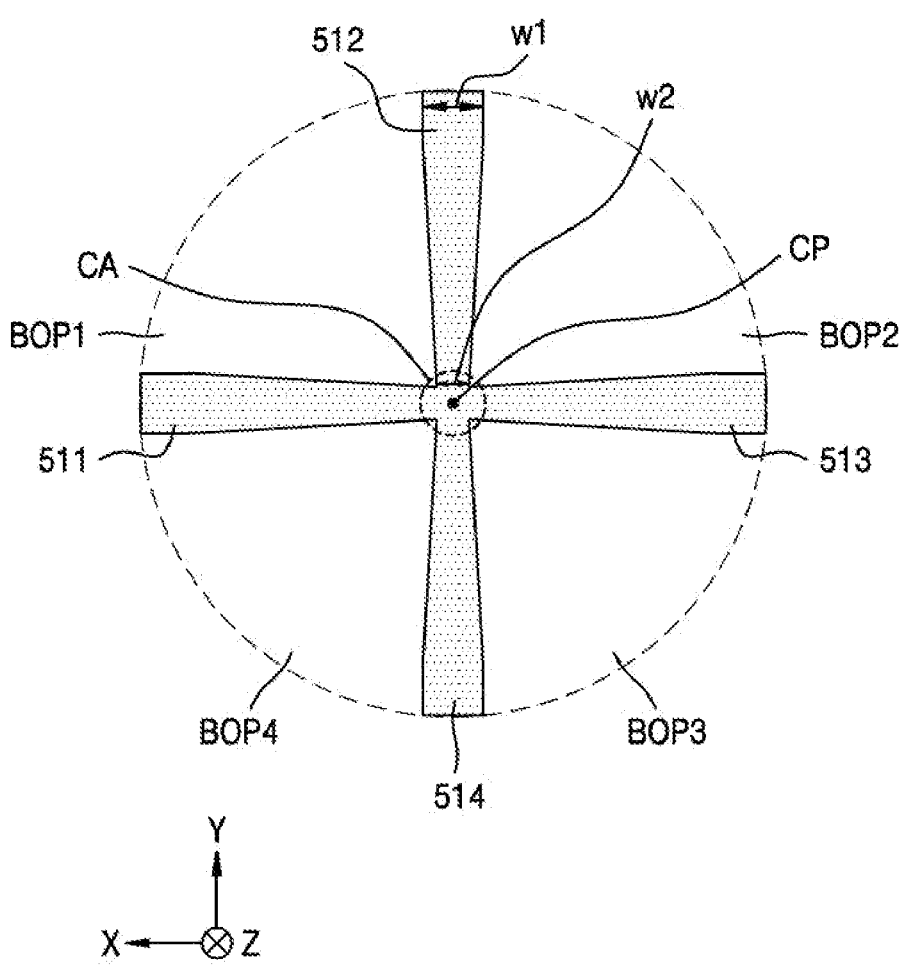

FIGS. 6 and 7 are schematic plan views of a portion of a display apparatus according to embodiments. FIGS. 6 and 7 schematically show partition walls meeting one another at a cross point CP of the bank 500.

Referring to FIG. 6, the bank 500 includes the first partition wall 511, the second partition wall 512, and the third partition wall 513 extending in different directions and meeting one another at the cross point CP. The first partition wall 511 may be a portion of partition walls defining a first bank well BOP1 and a third bank well BOP3, the second partition wall 512 may be a portion of partition walls defining the first bank well BOP1 and a second bank well BOP2, and the third partition wall 513 may be a portion of partition walls defining the second bank well BOP2 and the third bank well BOP3. For example, the first bank well BOP1 and the third bank well BOP3 may share the first partition wall 511, the first bank well BOP1 and the second bank well BOP2 may share the second partition wall 512, and the second bank well BOP2 and the third bank well BOP3 may share the third partition wall 513. In this regard, each of the first bank well BOP1, the second bank well BOP2, and the third bank well BOP3 may be one of the first well 501, the second well 502, the third well 503, the fourth well 504, and the auxiliary wells AOP.

In an embodiment, an angle θ1 between the first partition wall 511 and the second partition wall 512, an angle θ2 between the second partition wall 512 and the third partition wall 513, and an angle θ3 between the first partition wall 511 and the third partition wall 513 may each be a right angle or an obtuse angle. In the embodiment shown in FIG. 6, the angle θ1 between the first partition wall 511 and the second partition wall 512, the angle θ2 between the second partition wall 512 and the third partition wall 513, and the angle θ3 between the first partition wall 511 and the third partition wall 513 are each 120°, and thus, the first partition wall 511, the second partition wall 512, and the third partition wall 513 form a Y-shape at the cross point CP. In an embodiment, one of the angle θ1 between the first partition wall 511 and the second partition wall 512, the angle θ2 between the second partition wall 512 and the third partition wall 513, and the angle θ3 between the first partition wall 511 and the third partition wall 513 may be a right angle (i.e., 90°), and the other two angles may each be 135°. In another embodiment, two of the angle θ1 between the first partition wall 511 and the second partition wall 512, the angle θ2 between the second partition wall 512 and the third partition wall 513, and the angle θ3 between the first partition wall 511 and the third partition wall 513 may be right angles, and the other one angle may be 180°.

The first partition wall 511, the second partition wall 512, and the third partition wall 513 may have a first width w1. The first width w1 may be an average width of the first partition wall 511, the second partition wall 512, and the third partition wall 513 measured in a region away from the cross point CP by a certain distance. For example, the first width w1 may be about 14 μm. The first partition wall 511, the second partition wall 512, and the third partition wall 513 may have a second width w2 in a region adjacent to the cross point CP. The second width w2 may be less than the first width w1. For example, the second width w2 may be about 11 μm. In an embodiment, widths of the first partition wall 511, the second partition wall 512, and the third partition wall 513 may decrease from the first width w1 to the second width w2 in a direction nearing the cross point CP.

Referring to FIG. 7, the bank 500 includes the first partition wall 511, the second partition wall 512, the third partition wall 513, and a fourth partition wall 514 extending in different directions and meeting one another at the cross point CP. The first partition wall 511 may be a portion of partition walls defining the first bank well BOP1 and a fourth bank well BOP4, the second partition wall 512 may be a portion of partition walls defining the first bank well BOP1 and the second bank well BOP2, the third partition wall 513 may be a portion of partition walls defining the second bank well BOP2 and the third bank well BOP3, and the fourth partition wall 514 may be a portion of partition walls defining the third bank well BOP3 and the fourth bank well BOP4. In this regard, each of the first bank well BOP1, the second bank well BOP2, the third bank well BOP3, and the fourth bank well BOP4 may be one of the first well 501, the second well 502, the third well 503, the fourth well 504, and the auxiliary wells AOP.

The first partition wall 511, the second partition wall 512, the third partition wall 513, and the fourth partition wall 514 may meet partition walls adjacent thereto at right angles at the cross point CP. For example, the first partition wall 511 may meet the second partition wall 512 and the fourth partition wall 514 at right angles at the cross point CP, and the second partition wall 512 may meet the third partition wall 513 at a right angle at the cross point CP. Accordingly, the first partition wall 511, the second partition wall 512, the third partition wall 513, and the fourth partition wall 514 may form a "+" (or cross) shape at the cross point CP.

The first partition wall 511, the second partition wall 512, the third partition wall 513, and the fourth partition wall 514 may have the first width w1. The first width w1 may be an average width of the first partition wall 511, the second partition wall 512, the third partition wall 513, and the fourth partition wall 514 measured in a region away from the cross point CP by a certain distance. For example, the first width w1 may be about 14 μm. The first partition wall 511, the second partition wall 512, the third partition wall 513, and the fourth partition wall 514 may have the second width w2 in a region adjacent to (e.g., relatively nearer to) the cross point CP. The second width w2 may be less than the first width w1. For example, the second width w2 may be about 11 μm. In an embodiment, widths of the first partition wall 511, the second partition wall 512, the third partition wall 513, and the fourth partition wall 514 may decrease from the first width w1 to the second width w2 in a direction nearing the cross point CP.

In a region adjacent to the cross point CP, the first partition wall 511, the second partition wall 512, the third partition wall 513, and the fourth partition wall 514 have the second width w2, which is less than the first width w1, and thus, an area of a cross area CA at where the first partition wall 511, the second partition wall 512, the third partition wall 513, and the fourth partition wall 514 cross one another may be reduced. Accordingly, even when a material for forming a quantum dot layer is erroneously deposited in the cross area CA, the material may flow down into the first bank well BOP1, the second bank well BOP2, the third bank well BOP3, and/or the fourth bank well BOP4 and, thus, may not remain (or only a small amount thereof) may remain on the bank 500.

Figure 8:
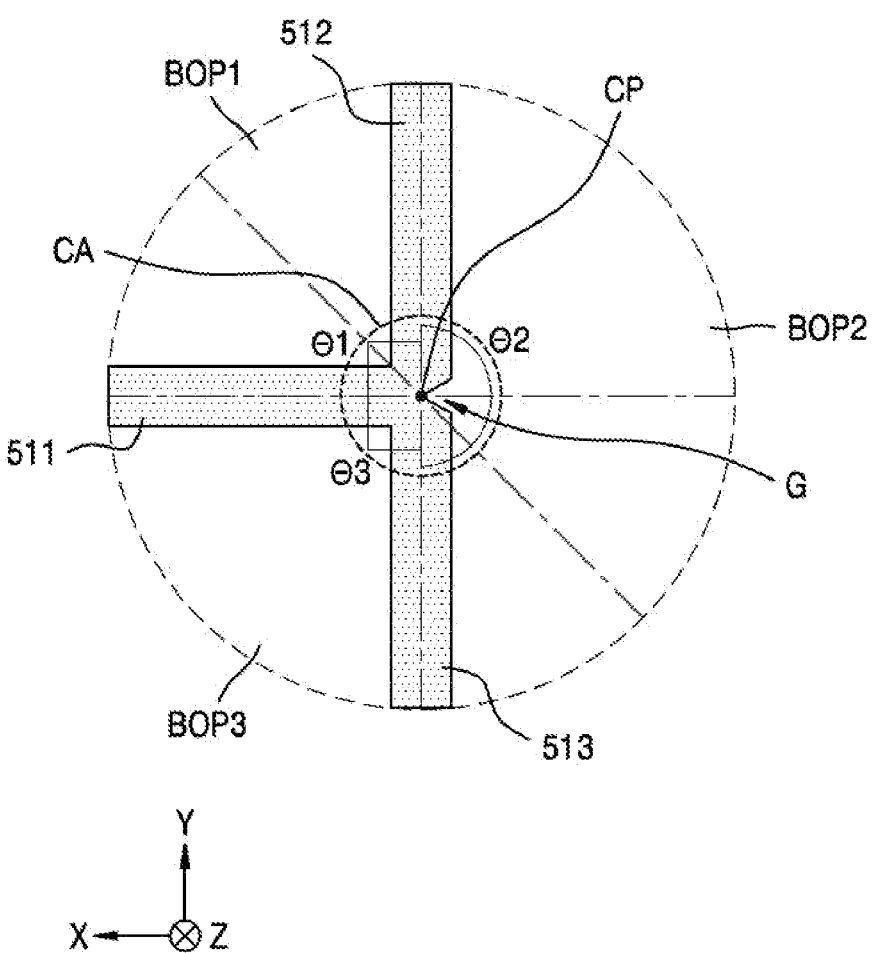
FIG. 8 is a schematic plan view of a portion of a display apparatus according to an embodiment.

FIG. 8 is a schematic plan view of a portion of a display apparatus according to an embodiment.

Referring to FIG. 8, the bank 500 includes the first partition wall 511, the second partition wall 512, and the third partition wall 513 extending in different directions and meeting one another at the cross point CP. The first partition wall 511 may be a portion of partition walls defining the first bank well BOP1 and the third bank well BOP3, the second partition wall 512 may be a portion of partition walls defining the first bank well BOP1 and the second bank well BOP2, and the third partition wall 513 may be a portion of partition walls defining the second bank well BOP2 and the third bank well BOP3. In this regard, each of the first bank well BOP1, the second bank well BOP2, and the third bank well BOP3 may be one of the first well 501, the second well 502, the third well 503, the fourth well 504, and the auxiliary wells AOP.

In an embodiment, the angle θ1 between the first partition wall 511 and the second partition wall 512, the angle θ2 between the second partition wall 512 and the third partition wall 513, and the angle θ3 between the first partition wall 511 and the third partition wall 513 may be a right angle or an obtuse angle. Although it is shown in FIG. 8 that the angle θ1 between the first partition wall 511 and the second partition wall 512 is a right angle, the angle θ2 between the second partition wall 512 and the third partition wall 513 is 180°, and the angle θ3 between the first partition wall 511 and the third partition wall 513 is a right angle such that the first partition wall 511, the second partition wall 512, and the third partition wall 513 form a T-shape at the cross point CP, embodiments of the present disclosure are not limited thereto. For example, the angle θ1 between the first partition wall 511 and the second partition wall 512, the angle θ2 between the second partition wall 512 and the third partition wall 513, and the angle θ3 between the first partition wall 511 and the third partition wall 513 may each be 120° such that the first partition wall 511, the second partition wall 512, and the third partition wall 513 may form a Y-shape at the cross point CP. In another embodiment, one of the angle θ1 between the first partition wall 511 and the second partition wall 512, the angle θ2 between the second partition wall 512 and the third partition wall 513, and the angle θ3 between the first partition wall 511 and the third partition wall 513 may be a right angle, and the other two angles may each be 135°.

A groove G formed by removing a portion of the bank 500 at where the second partition wall 512 and the third partition wall 513 contact each other may be formed between the second partition wall 512 and the third partition wall 513 neighboring each other. The groove G may have a wedge shape widening in a direction from the cross point CP toward side surfaces of the second partition wall 512 and the third partition wall 513. The groove G may be between partition walls in which partition walls neighboring each other have a large angle therebetween. In an embodiment, one or more grooves G may be between the first partition wall 511 and the second partition wall 512, between the second partition wall 512 and the third partition wall 513, and between the first partition wall 511 and the third partition wall 513. The first partition wall 511, the second partition wall 512, and the third partition wall 513 may contact one another at the cross point CP.

Although it is shown in FIG. 8 that three partition walls meet one another at the cross point CP, in another embodiment, four partition walls may meet one another at the cross point CP. For example, four partition walls may meet one another at right angles at the cross point CP to form a "+" (or cross) shape. Even in this case, the groove G may be formed by removing a portion of the bank 500 at where neighboring partition walls contact each other.

A region adjacent to the cross point CP has the groove G formed by removing a portion of the first partition wall 511, the second partition wall 512, and the third partition wall 513, and thus, an area of the cross area CA at where the first partition wall 511, the second partition wall 512, and the third partition wall 513 cross one another may decrease. Accordingly, even when a material for forming a quantum dot layer is erroneously deposited in the cross area CA, the material may flow down into the first bank well BOP1, the second bank well BOP2, and/or the third bank well BOP3 and, thus, may not remain (or only a small amount thereof may remain) on the bank 500.

Figure 9:
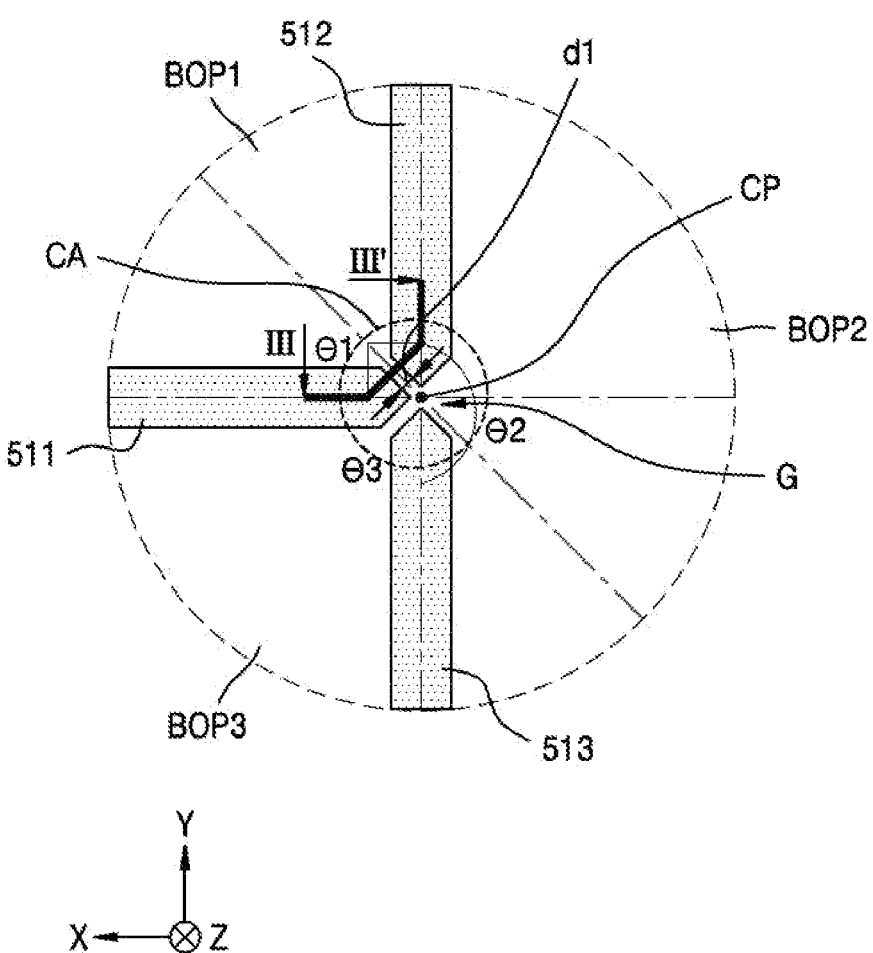
FIGS. 9 and 10 are schematic plan views of a portion of a display apparatus according to embodiments.
Figure 10:
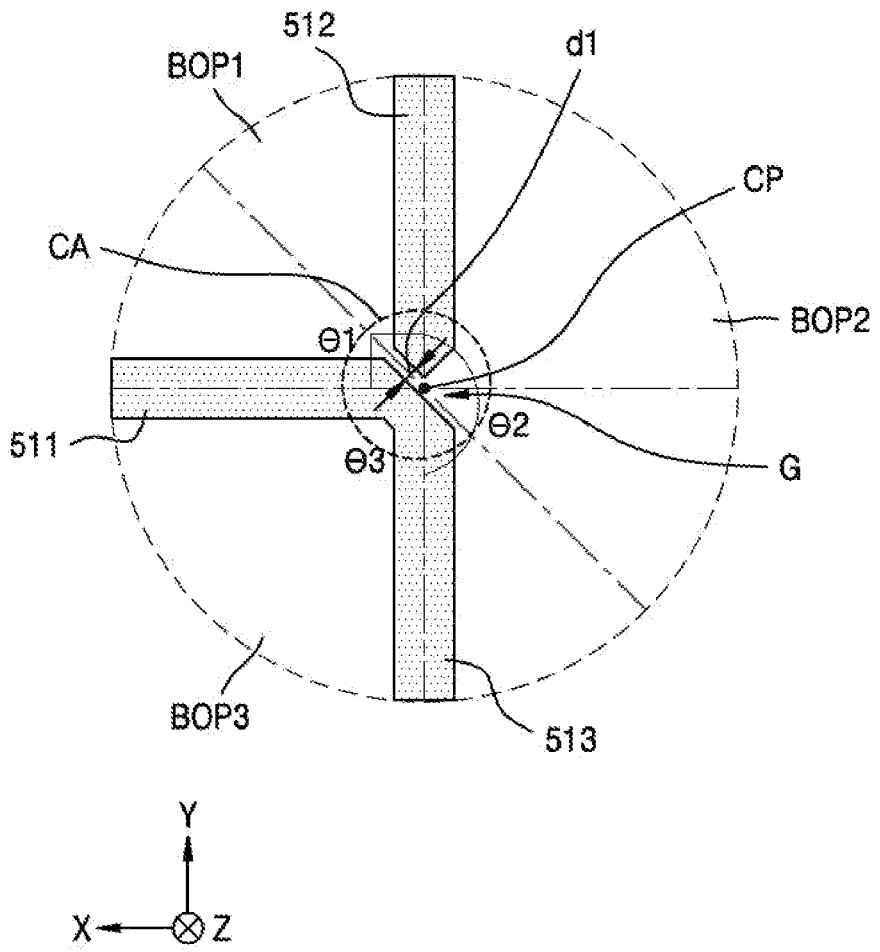
Figure 11:
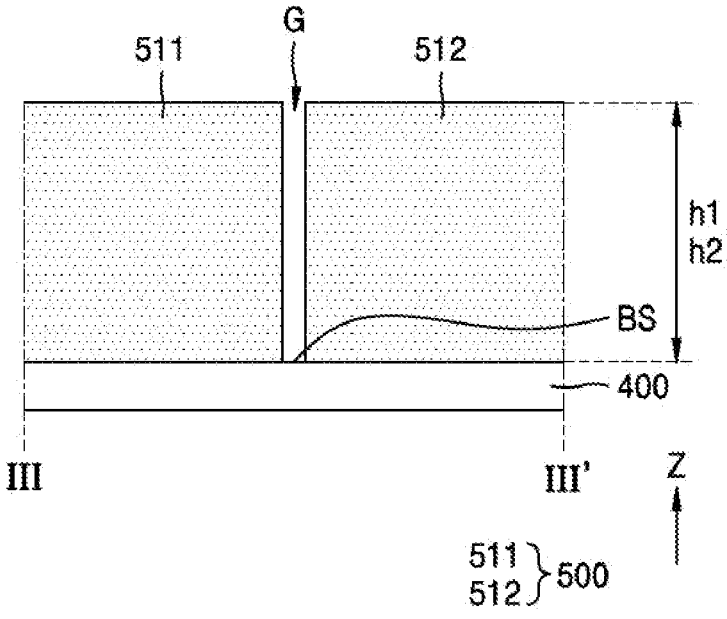
FIG. 11 is schematic cross-sectional views of the display apparatus shown in FIG. 9 taken along the line III-III' in FIG. 9.
Figure 12:
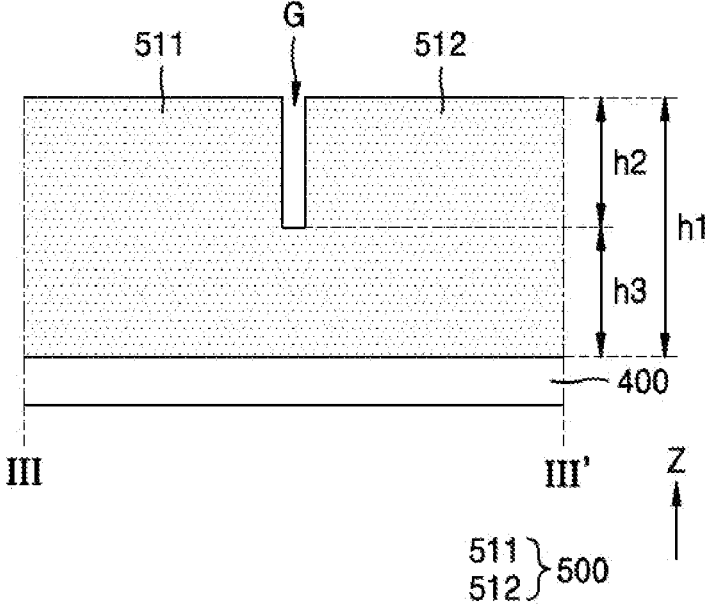
FIG. 12 is schematic cross-sectional views of a display apparatus according to an embodiment.

FIGS. 9 and 10 are schematic plan views of a portion of a display apparatus according to embodiments. FIGS. 11 and 12 are schematic cross-sectional views of the display apparatus taken along the line III-III' of FIG. 9.

Referring to FIG. 9, the bank 500 includes the first partition wall 511, the second partition wall 512, and the third partition wall 513 extending in different directions and meeting one another at the cross point CP. The first partition wall 511 may be a portion of partition walls defining the first bank well BOP1 and the third bank well BOP3, the second partition wall 512 may be a portion of partition walls defining the first bank well BOP1 and the second bank well BOP2, and the third partition wall 513 may be a portion of partition walls defining the second bank well BOP2 and the third bank well BOP3. In this regard, each of the first bank well BOP1, the second bank well BOP2, and the third bank well BOP3 may be one of the first well 501, the second well 502, the third well 503, the fourth well 504, and the auxiliary wells AOP.

In an embodiment, the angle $\theta1$ between the first partition wall 511 and the second partition wall 512, the angle $\theta2$ between the second partition wall 512 and the third partition wall 513, and the angle $\theta3$ between the first partition wall 511 and the third partition wall 513 may be a right angle or an obtuse angle. Although it is shown in FIG. 9 that the angle $\theta1$ between the first partition wall 511 and the second partition wall 512 is a right angle, the angle $\theta2$ between the second partition wall 512 and the third partition wall 513 is 180°, and the angle $\theta3$ between the first partition wall 511 and the third partition wall 513 is a right angle such that the first partition wall 511, the second partition wall 512, and the third partition wall 513 form a T-shape at the cross point CP, embodiments of the present disclosure are not limited thereto.

Grooves G may be formed in the bank 500 between the first partition wall 511 and the second partition wall 512, between the second partition wall 512 and the third partition wall 513, and between the first partition wall 511 and the third partition wall 513, neighboring each other. For example, the grooves G between the first partition wall 511 and the second partition wall 512 and between the first partition wall 511 and the third partition wall 513 may have a straight shape passing through the cross point CP, and the groove G between the second partition wall 512 and the third partition wall 513 may have a wedge shape widening in a direction from the cross point CP toward side surfaces of the second partition wall 512 and the third partition wall 513. In an embodiment, the groove G between the second partition wall 512 and the third partition wall 513 may also have a straight shape passing through the cross point CP. When viewed in a direction perpendicular to the lower surface 400a of the first substrate 400 (see, e.g., FIG. 1), upper surfaces of the first partition wall 511, the second partition wall 512, and the third partition wall 513 may be apart from one another with the grooves G therebetween. For example, when viewed in a direction perpendicular to the lower surface 400a of the first substrate 400 (see, e.g., FIG. 1), upper surfaces of the first partition wall 511, the second partition wall 512, and the third partition wall 513 may be separated by the grooves G. A width dl of the grooves G having a straight shape between the first partition wall 511 and the second partition wall 512 and between the first partition wall 511 and the third partition wall 513 may be about 1 μm.

Referring to FIG. 10, the grooves G may be formed between the first partition wall 511 and the second partition wall 512 and between the second partition wall 512 and the third partition wall 513, neighboring each other, and the first partition wall 511 and the third partition wall 513 may be connected to each other. For example, partition walls defining the third bank well BOP3 may be closed (e.g., may contact each other) at the cross point CP. In this regard, the third bank well BOP3 may be the first well 501 (see, e.g., FIG. 1) holding the first quantum dot layer 415, the second well 502 (see, e.g., FIG. 3) holding the second quantum dot layer 425, or the third well 503 holding the transmissive layer 435.

FIGS. 11 and 12 schematically show cross-sections of the first substrate 400, the first partition wall 511, and the second partition wall 512. Although FIGS. 11 and 12 show the bank 500 including the first partition wall 511 and the second partition wall 512 and the first substrate 400, as shown in FIG. 1, a color filter layer may be between the bank 500 and the first substrate 400. In such an embodiment, a base surface BS acting as a reference for a height h1 of the bank 500 may be an upper surface of the color filter layer. In another embodiment, as shown in FIG. 4, a color filter layer, a low refractive index layer, and an additional protective layer may be arranged between the bank 500 and the first substrate 400. In such an embodiment, the base surface BS acting as a reference for the height h1 of the bank 500 may be an upper surface of the additional protective layer.

Referring to FIG. 11, a height (or depth) h2 of the groove G formed between the first partition wall 511 and the second partition wall 512 may be the same as the height h1 of the bank 500. In other words, the groove G may be formed by removing a portion of the bank 500 from upper surfaces of the first partition wall 511 and the second partition wall 512 to the base surface BS. In such an embodiment, a side surface of the bank 500 may be hydrophobic. Because a side surface of the bank 500 is hydrophobic, even when a material for forming a quantum dot layer is held in some wells of the first bank well BOP1, the second bank well BOP2, and/or the third bank well BOP3, the material may not leak into a neighboring well through the groove G.

Referring to FIG. 12, the height h2 of the groove G formed between the first partition wall 511 and the second partition wall 512 may be less than the height h1 of the bank 500. That is, the groove G may separate upper surfaces of the first partition wall 511 and the second partition wall 512 but may not reach the base surface BS. In such an embodiment, a height h3 of a material for forming a quantum dot layer held in the first bank well BOP1, the second bank well BOP2, or the third bank well BOP3 may be the same as or less than the height h1 of the bank 500 minus the height h2 of the groove G. In such an embodiment, even when a side surface of the bank 500 is not hydrophobic, the material for forming a quantum dot layer held in the first bank well BOP1, the second bank well BOP2, or the third bank well BOP3 may not leak into a neighboring well through the groove G.

Although FIGS. 9 and 10 show three partition walls meeting one another at the cross point CP, in another embodiment, four partition walls may meet one another at the cross point CP. For example, four partition walls may meet one another at right angles at the cross point CP to form a "+" (or cross) shape. Even in such an embodiment, the groove G may be formed by removing a portion where neighboring partition walls contact each other.

A region adjacent to the cross point CP has the groove G formed by removing a portion of the first partition wall 511, the second partition wall 512, and the third partition wall 513, and thus, an area of the cross area CA where the first partition wall 511, the second partition wall 512, and the third partition wall 513 cross one another may be reduced. Accordingly, even when a material for forming a quantum dot layer is erroneously deposited in the cross area CA, the material may flow down into the first bank well BOP1, the second bank well BOP2, and/or the third bank well BOP3 and, thus, may not remain (or only a small amount thereof may remain) on the bank 500.

Figure 13:
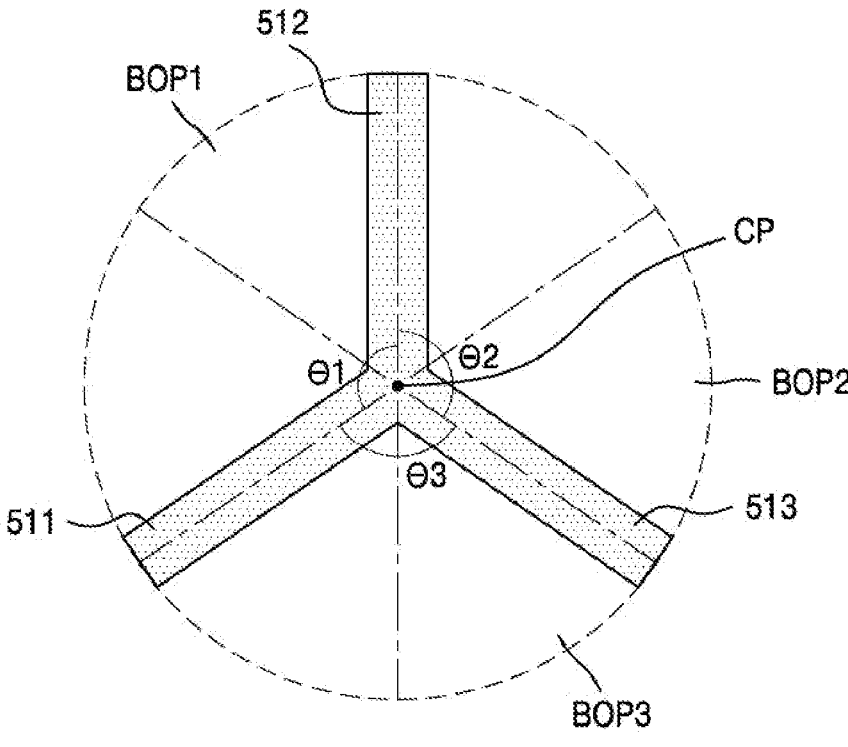
FIGS. 13 and 14 are schematic plan views of a portion of a display apparatus according to embodiments.
Figure 13:
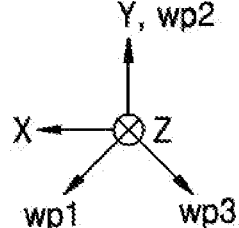
Figure 14:
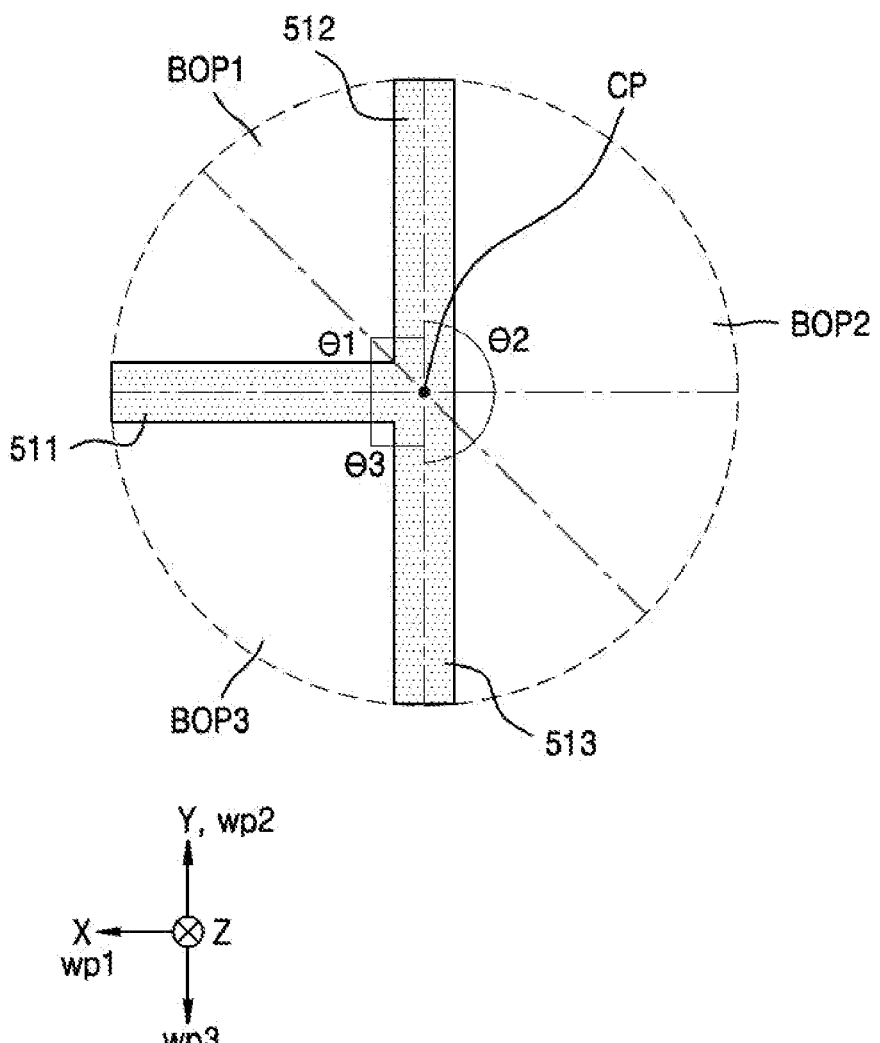

FIGS. 13 and 14 are schematic plan views of a portion of a display apparatus according to an embodiment.

In FIGS. 13 and 14, the bank 500 includes the first partition wall 511, the second partition wall 512, and the third partition wall 513 extending in the first direction wp1, the second direction wp2, and the third direction wp3, respectively, and meeting one another at the cross point CP. The first partition wall 511 may be a portion of partition walls defining the first bank well BOP1 and the third bank well BOP3, the second partition wall 512 may be a portion of partition walls defining the first bank well BOP1 and the second bank well BOP2, and the third partition wall 513 may be a portion of partition walls defining the second bank well BOP2 and the third bank well BOP3. For example, the first bank well BOP1 and the third bank well BOP3 may share the first partition wall 511, the first bank well BOP1 and the second bank well BOP2 may share the second partition wall 512, and the second bank well BOP2 and the third bank well BOP3 may share the third partition wall 513. In this regard, each of the first bank well BOP1, the second bank well BOP2, and the third bank well BOP3 may be one of the first well 501, the second well 502, the third well 503, the fourth well 504, and the auxiliary wells AOP.

In an embodiment, the angle θ1 between the first partition wall 511 and the second partition wall 512, the angle θ2 between the second partition wall 512 and the third partition wall 513, and the angle θ3 between the first partition wall 511 and the third partition wall 513 may be a right angle or an obtuse angle. In this regard, FIG. 13 shows that the angle θ1 between the first partition wall 511 and the second partition wall 512, the angle θ2 between the second partition wall 512 and the third partition wall 513, and the angle θ3 between the first partition wall 511 and the third partition wall 513 are each 120° such that the first partition wall 511, the second partition wall 512, and the third partition wall 513 form a Y-shape at the cross point CP. In an embodiment, one of the angle θ1 between the first partition wall 511 and the second partition wall 512, the angle θ2 between the second partition wall 512 and the third partition wall 513, and the angle θ3 between the first partition wall 511 and the third partition wall 513 may be a right angle, and the other two angles may each be 135°. In another embodiment, as shown in FIG. 14, two of the angle θ1 between the first partition wall 511 and the second partition wall 512, the angle θ2 between the second partition wall 512 and the third partition wall 513, and the angle θ3 between the first partition wall 511 and the third partition wall 513 may be right angles, and the other one angle may be 180°. In such an embodiment, the first partition wall 511, the second partition wall 512, and the third partition wall 513 may form a T-shape at the cross point CP.

As shown in FIG. 2, the number of partition walls that meet each other at cross points CP where partition walls extending in different directions meet each other may be three or less. In such an embodiment, at every cross point CP, two partition walls extending in different directions may meet each other to form a bent straight line, or three partition walls extending in different directions may meet one another to form a Y-shape or T-shape.

When four or more partition walls meet one another at the cross point CP, an area of upper surfaces of the partition walls at the cross point CP may increase, and thus, a height of a material of an erroneously deposited quantum dot layer may increase. In the described embodiments, the number of partition walls meeting each other at every cross point CP of the bank 500 (see, e.g., FIG. 2) is three or less, and thus, a height of a material of an erroneously deposited quantum dot layer may reduced.

Figure 15:
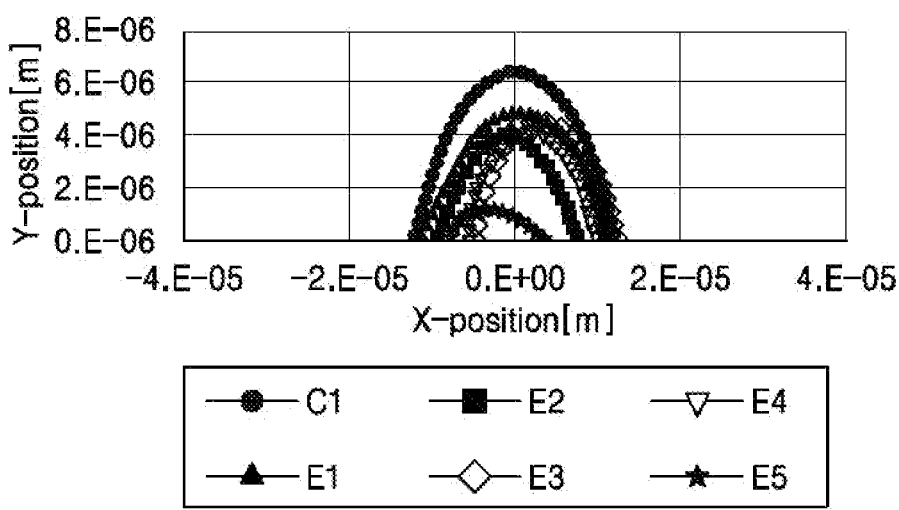
FIG. 15 is a graph showing a cross-sectional shape of a material for forming a quantum dot layer erroneously deposited on a partition wall in display apparatuses according to a comparative example and embodiments of the present disclosure.
Figure 16:
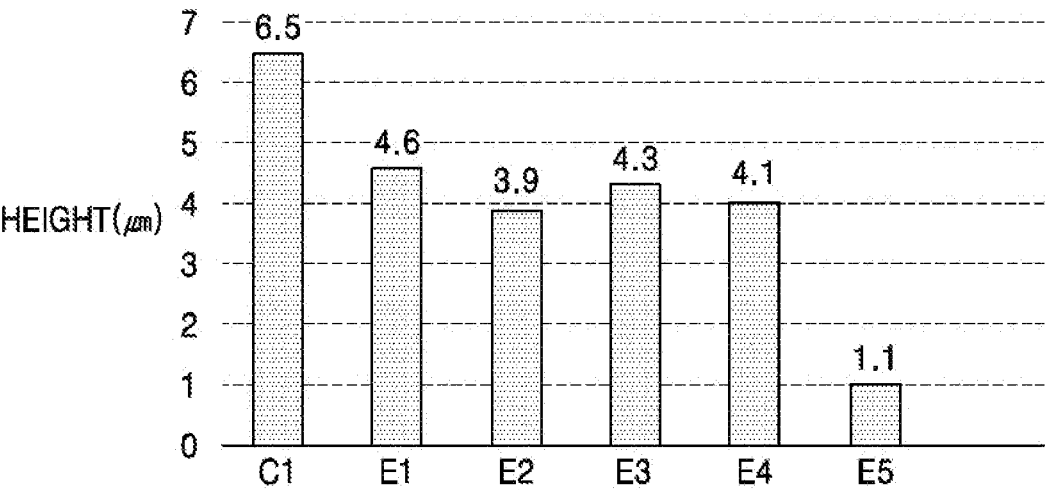
FIG. 16 is a graph showing a maximum height of remaining ink of the comparative example and the embodiments described with respect to FIG. 15.

FIG. 15 is a graph showing a cross-sectional shape of a material for forming a quantum dot layer erroneously deposited on a partition wall in display apparatuses according to a comparative example (C1) and embodiments of the present disclosure (E1-E5). FIG. 16 is a graph showing a maximum height of a material for forming a quantum dot layer erroneously deposited on a partition wall of the comparative example and the embodiments described with respect to FIG. 15.

FIGS. 15 and 16 are graphs obtained by simulating, when a material for forming a quantum dot layer is erroneously deposited on a point where partition walls of a bank having hydrophobic upper and side surfaces cross one another, a shape of a residual material on upper surfaces of the partition walls crossing one another. Comparative Example (C1) is a result of measuring a shape and height of a residual material when four partition walls extending in different directions meet one another at right angles at a cross point to form a "+" (or cross) shape. Embodiment 1 (E1) is a result of measuring a shape and height of a residual material when three partition walls extending in different directions from one another form a Y-shape at a cross point as shown in FIG. 13, Embodiment 3 (E3) is a result of measuring a shape and height of a residual material when angles between three partition walls extending in different directions from one another are 90°, 135°, and 135°, and Embodiment 4 (E4) is a result of measuring a shape and height of a residual material when three partition walls extending in different directions from one another form a T-shape at a cross point as shown in FIG. 14. Embodiment 2 (E2) is a result of measuring a shape and height of a residual material when three partition walls extending in different directions from one another form a Y-shape at a cross point and have a width less than an average width as shown in FIG. 6, and Embodiment 5 (E5) is a result of measuring a shape and height of a residual material when three partition walls including a straight groove passing through a cross point and a wedge-shaped groove form a T-shape at the cross point as shown in FIG. 9.

In Comparative Example (C1), an x-direction width of the residual material on upper surfaces of partition walls crossing one another was greatest, and a height thereof was also greatest at about 6.5 μm. The residual materials of Embodiment 1 (E1), Embodiment 3 (E3), and Embodiment 4 (E4) where partition walls have the same width and three partition walls extending in different directions meet one another at a cross point had a smaller x-direction width compared to Comparative Example (C1) and respective heights thereof were also reduced to about 4.6 μm, about 4.3 μm, and about 4.1 μm. The residual material of Embodiment 2 (E2) where three partition walls extending in different directions from one another have a reduced width at a cross point had a small x-direction width compared to Comparative Example (C1) and had a height of about 3.9 μm. Embodiment 5 (E5) where a groove is formed between neighboring partition walls had an x-direction width significantly reduced compared to Comparative Example (C1) and had a height of about 1.1 μm.

In the display apparatuses according to Embodiment 1 (E1) to Embodiment (E5), an area of partition walls may be reduced at a cross point of a bank, and thus, a height of a residual material erroneously deposited in an area adjacent to the cross point may be reduced by as much as a minimum of about 1.9 μm to a maximum of about 5.4 μm compared to Comparative Example (C1). Accordingly, the occurrence of defects in other elements due to the residual material may be prevented or reduced.

According to one or more of the embodiments of the present disclosure, a display apparatus in which the occurrence of defects is reduced in a manufacturing process may be provided. However, the present disclosure is not limited by such aspects and features.

It should be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A display apparatus comprising:
a first substrate;
a bank on the first substrate and comprising partition walls defining a first well, a second well, a third well, and auxiliary wells, the partition walls having a second width that is less than a first width, the first width being an average width of the partition walls farther away from a cross point at where three or more partition walls extending in different directions meet one another, the second width being an average width of the partition walls at the cross point;
a first quantum dot layer in the first well; and
a second quantum dot layer in the second well.

2. The display apparatus of claim 1, wherein the first quantum dot layer is configured to convert light having a wavelength in a first wavelength band into light having a wavelength in a second wavelength band as it passes therethrough, and
wherein the second quantum dot layer is configured to convert light having a wavelength in the first wavelength band into light having a wavelength in a third wavelength band as it passes therethrough.

3. The display apparatus of claim 1, further comprising a transmissive layer in the third well through which light is transmitted without change to its wavelength.

4. The display apparatus of claim 1, further comprising:
a second substrate under the first substrate with the bank therebetween;
a first pixel electrode corresponding to the first well, a second pixel electrode corresponding to the second well, and a third pixel electrode corresponding to the third well, the first to third pixel electrodes being apart from one another on the second substrate;
a pixel-defining layer covering edges of each of the first pixel electrode, the second pixel electrode, and the third pixel electrode and having an opening exposing a central portion of the first pixel electrode, an opening exposing a central portion of the second pixel electrode, and an opening exposing a central portion of the third pixel electrode;
an emission layer on the first to third pixel electrodes and configured to emit light having a wavelength in a first wavelength band; and
an opposite electrode on the emission layer.

5. The display apparatus of claim 4, wherein the partition walls of the bank define a fourth well that, in a plan view, is apart from the first pixel electrode, the second pixel electrode, and the third pixel electrode, and
wherein each of the first to fourth wells is surrounded, in the plan view, by the auxiliary wells.

* * * * *